(12) United States Patent
Bairo

(10) Patent No.: US 10,574,926 B2
(45) Date of Patent: *Feb. 25, 2020

(54) ANALOG-TO-DIGITAL CONVERTER, SOLID-STATE IMAGING APPARATUS, AND ELECTRONIC APPARATUS

(71) Applicant: SONY CORPORATION, Tokyo (JP)

(72) Inventor: Masaaki Bairo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,365

(22) Filed: Jan. 22, 2019

(65) Prior Publication Data

US 2019/0158771 A1 May 23, 2019

Related U.S. Application Data

(63) Continuation of application No. 15/306,841, filed as application No. PCT/JP2015/083717 on Dec. 1, 2015, now Pat. No. 10,237,507.

(30) Foreign Application Priority Data

Mar. 4, 2015 (JP) ................... 2015-042633

(51) Int. Cl.
| | | |
|---|---|---|
| *H04N 5/378* | (2011.01) | |
| *H01L 23/522* | (2006.01) | |
| *H03M 1/56* | (2006.01) | |
| *H03M 1/08* | (2006.01) | |
| *H04N 9/04* | (2006.01) | |
| *H01L 21/822* | (2006.01) | |
| *H01L 27/04* | (2006.01) | |
| *H03M 1/12* | (2006.01) | |

(52) U.S. Cl.
CPC ........... *H04N 5/378* (2013.01); *H01L 21/822* (2013.01); *H01L 23/5223* (2013.01); *H01L 27/04* (2013.01); *H03M 1/08* (2013.01); *H03M 1/56* (2013.01); *H04N 9/045* (2013.01); *H03M 1/123* (2013.01)

(58) Field of Classification Search
CPC .... H04N 5/3572; H04N 5/361; H04N 5/3745; H04N 5/37455; H04N 5/378; H04N 9/045; H03M 1/004; H03M 1/007; H03M 1/08; H03M 1/123; H03M 1/56; H01L 21/822; H01L 23/5223; H01L 27/04
See application file for complete search history.

(56) References Cited

U.S. PATENT DOCUMENTS 9,281,281 B2 * 3/2016 Cowley ................. H01L 23/60
2006/0086965 A1 * 4/2006 Sakaguchi .......... H01L 23/5223
257/307

(Continued)

*Primary Examiner* — Lin Ye
*Assistant Examiner* — Chriss S Yoder, III
(74) *Attorney, Agent, or Firm* — Sheridan Ross P.C.

(57) ABSTRACT

An analog-to-digital converter includes a comparator having paired differential input ends, and a first capacitor and a second capacitor each provided at respective differential input ends. The first capacitor includes a plurality of first sub-capacitors that are coupled side by side with one another, and the second capacitor includes a plurality of second sub-capacitors that are coupled side by side with one another. The plurality of first sub-capacitors and the plurality of second sub-capacitors are mixedly arranged in each column of a plurality of columns.

20 Claims, 31 Drawing Sheets

(56) References Cited

U.S. PATENT DOCUMENTS

| | | | |
|---|---|---|---|
| 2006/0181656 A1* | 8/2006 | Nabeshima | H01L 27/0207 |
| | | | 349/51 |
| 2013/0001403 A1* | 1/2013 | Yamakawa | H01L 27/14609 |
| | | | 250/208.1 |
| 2013/0100326 A1* | 4/2013 | Ueno | H03F 3/72 |
| | | | 348/300 |
| 2013/0194719 A1* | 8/2013 | Matsukawa | H01L 23/5223 |
| | | | 361/303 |
| 2015/0236711 A1* | 8/2015 | Aruga | H01L 23/5225 |
| | | | 341/150 |

\* cited by examiner

IH-IH CROSS-SECTIONAL DIAGRAM

ANALOG-TO-DIGITAL CONVERTER, SOLID-STATE IMAGING APPARATUS, AND ELECTRONIC APPARATUS

CROSS REFERENCE TO RELATED APPLICATIONS

This application is a continuation of U.S. patent application Ser. No. 15/306,841, filed Oct. 26, 2016, which is a national stage application under 35 U.S.C. 371 and claims the benefit of PCT Application No. PCT/JP2015/083717 having an international filing date of Dec. 1, 2015, which designated the United States, which PCT application claimed the benefit of Japanese Patent Application No. 2015-042633 filed Mar. 4, 2015, the disclosures of which are incorporated herein by reference in their entirety.

TECHNICAL FIELD

The disclosure relates to an analog-to-digital converter that converts an analog signal into a digital signal, and to a solid-state imaging apparatus and an electronic apparatus each including the analog-to-digital converter.

BACKGROUND ART

Examples of a solid-state imaging apparatus that images an image may include a charge coupled device (CCD) image sensor and a complementary metal oxide semiconductor (CMOS) image sensor. In recent years, the CMOS image sensor has attracted attention for requests such as downsizing.

The CMOS image sensor includes an analog to digital (AD) conversion section (hereinafter, referred to as an AD conversion section). The AD conversion section performs AD conversion on an analog electric signal supplied from a pixel that performs photoelectric conversion. A so-called column-parallel AD conversion section is employed as the AD conversion section of the CMOS image sensor for requests such as process acceleration. (for example, PTL 1).

The column-parallel AD conversion section is able to perform AD conversion, for each column, on electric signals supplied from two or more (for example, all) pixels of a pixel group arranged in each row. For example, in the column-parallel AD conversion section, AD converters (ADCs: Analog-to-digital converters) of the number equivalent to the number of columns of the pixels are arranged side by side along the row direction. Each of the ADCs is configured to perform AD conversion of the electric signal that is supplied from a pixel of corresponding column.

Examples of the ADC may include a so-called reference signal comparative ADC. The reference signal comparative ADC includes a comparator and a counter, and compares a predetermined reference signal with an electric signal supplied from a pixel to perform the AD conversion of the electric signal. In PTL 1 mentioned above, a single slope ADC is used as the reference signal comparative ADC.

In the single slope ADC, the comparator compares a reference signal whose level is varied with a fixed gradient, such as a ramp signal, with the electric signal supplied from the pixel. The counter counts a time necessary for level change of the reference signal until the reference signal and the electric signal are coincident with each other in level. As a result, the signal is converted into a digital signal.

Sampling capacitances are coupled in series with respective paired differential input terminals of the comparator. To obtain favorable characteristics of the ADC, small fluctuation of a capacitance value (small bias dependency of the capacitance value) with respect to the input signal is desired in the sampling capacitances.

In contrast, a comb-shaped wiring capacitor (for example, PTL 2) has been proposed in which paired comb-shaped wiring lines are so oppositely disposed as to engage with each other and a parasitic capacitance caused between the opposite wiring lines is used. The comb-shaped wiring capacitor is small in bias dependency of the capacitance value and is mountable on a semiconductor substrate at a low cost.

CITATION LIST

Patent Literature

PTL 1: Japanese Unexamined Patent Application Publication No. 2013-90305
PTL 2: Japanese Unexamined Patent Application Publication No. 2005-183739

SUMMARY OF INVENTION

Crosstalk characteristics of the signal is one of important performance indices for the column-parallel AD conversion section as mentioned above. In the column-parallel AD conversion section, the crosstalk characteristics between comparators configuring the respective ADCs (a comparator of an ADC in a certain column and a comparator of an ADC in a column adjacent to the certain column) influence crosstalk characteristics of the entire AD conversion section.

One of factors deteriorating the crosstalk characteristics between the adjacent comparators is a parasitic capacitance (a coupling capacitance) at occurs between the comparators to join the two comparators.

When, in the column-parallel ADC described in the foregoing PTL 1, the sampling capacitances configuring a portion of the comparator are replaced with, for example, the comb-shaped wiring capacitors as described in the foregoing PTL 2, it is desired to design the capacitor with layout arrangeable within a predetermined space of the pixel array section while retaining a certain capacitance value or more.

In recent years, however, precision of semiconductor process has been improved and a pixel size has been reduced, for example. When a device is designed to be arrangeable within a predetermined space while obtaining a desired capacitance value, the following defects may occur. In other words, a facing area between the sampling capacitances of the comparator is increased between the adjacent ADCs, which results in large parasitic capacitance between the adjacent ADCs. This causes deterioration of the crosstalk characteristics as mentioned above.

Such deterioration of the crosstalk characteristics between the ADCs and deterioration of the crosstalk characteristics of the AD conversion section may cause deterioration of image quality, for example, color mixture of an image captured by a CMOS image sensor, bleeding of brightness, and expansion of influence of a defective pixel.

Therefore, it is desirable to provide an analog-to-digital converter, a solid-state imaging apparatus, and an electronic apparatus that make it possible to suppress crosstalk of a signal.

An analog-to-digital converter according to an embodiment of the disclosure includes: a comparator having paired differential input ends; and first and second capacitors provided at the respective differential input ends. The first capacitor includes a plurality of first sub-capacitors that are coupled side by side with one another, and the second capacitor includes a plurality of second sub-capacitors that are coupled side by side with one another. The plurality of first sub-capacitors and the plurality of second sub-capacitors are mixedly arranged in each column of a plurality of columns.

In the analog-to-digital converter according to an embodiment of the disclosure, the first and the second capacitors provided at the respective differential input ends of the comparator respectively include the plurality of first sub-capacitors and the plurality of second sub-capacitors that are coupled side by side with one another. The first and second sub-capacitors are mixedly arranged in each column of a plurality of columns. This reduces a facing area of the capacitors between the comparators in adjacent columns, for example, even if the first and second sub-capacitors are used in a state of being arranged side by side, as compared with the case where the capacitors are linearly arranged for each column.

A solid-state imaging apparatus according to an embodiment of the disclosure includes the above-described analog-to-digital converter according to an embodiment of the disclosure.

An electronic apparatus according to an embodiment of the disclosure includes the above-described analog-to-digital converter according to an embodiment of the disclosure.

According to the analog-to-digital converter of an embodiment of the disclosure, the first and second capacitors are provided at the respective differential input ends of the comparator, and the first and second capacitors respectively include the plurality of first and second sub-capacitors that are coupled side by side with one another. The first and second sub-capacitors are mixedly arranged in each column of a plurality of columns. This reduces a facing area of the capacitors between the comparators in adjacent columns, for example, even if the first and second sub-capacitors are used in a state of being arranged side by side. This makes it possible to suppress a parasitic capacitance occurring between the adjacent converters. Thus, it is possible to suppress crosstalk of a signal.

According to the solid-state imaging apparatus and the electronic apparatus of an embodiment of the disclosure, provision of the above-described analog-to-digital converter according to an embodiment of the disclosure makes it possible to suppress crosstalk of a signal occurring between the analog-to-digital converters. Thus, it is possible to suppress deterioration of a captured image.

Note that the above-described contents are examples of the disclosure. Effects of an embodiment of the disclosure are not limited to those described above, and may be effects other than those described above or may thither include other effects.

DESCRIPTION OF EMBODIMENTS

Some embodiments of the disclosure are described in detail below with reference to drawings. Note that description is given in the following order.

1. First embodiment (an example of a solid-state imaging apparatus using an ADC in which sampling capacitances are each divided into a plurality of sub-capacitances, and the plurality of sub-capacitances are coupled side by side with one another and are so arranged as to meander in a plane direction)
2. First configuration example (an example in a case where sampling capacitances are disposed in four layers)
3. Modification example of first configuration example (an example in a case where sampling capacitances are disposed in three layers)
4. Second embodiment and second configuration example (an example in a case where sampling capacitances are so disposed as to meander in both of a plane direction and a stacked-layer direction)
5. Third embodiment and third configuration example (an example in a case where sampling capacitances are so disposed as to meander in a stacked-layer direction)
6. Fourth embodiment and fourth configuration example (an example in a case where electrostatic shielding layers are disposed to sandwich sampling capacitances)
7. Modification example of fourth embodiment (an example in a case where an electrostatic shielding layer is disposed to cover sampling capacitances)
8. Modification example 1 (another example of a circuit configuration of sampling capacitances)
9. Modification examples 2-1 and 2-2 (configuration examples of an MOS capacitor and an MIM capacitor)
10. Application examples 1 to 6 (examples of an electronic apparatus)

<First Embodiment>

[Configuration]

Figure 1:
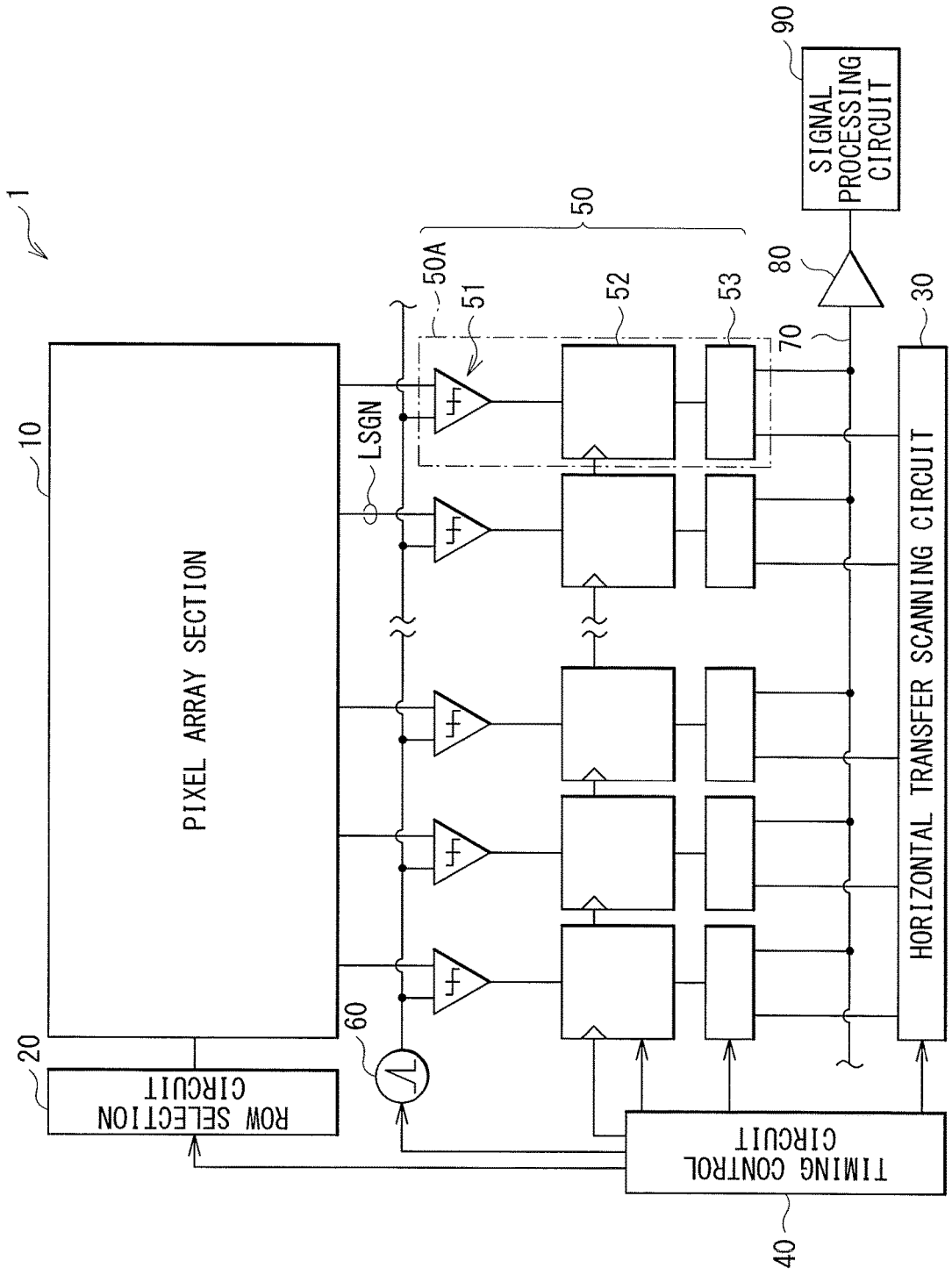
FIG. 1 is a block diagram illustrating an entire configuration of a solid-state imaging apparatus according to a first embodiment of the disclosure.

FIG. 1 is a diagram illustrating an entire configuration of a solid-state imaging apparatus (a solid-state imaging apparatus 1) according to a first embodiment of the disclosure. The solid-state imaging apparatus 1 may be, for example, a CMOS image sensor mounted with an analog-to-digital converter (ADC 50A) of the disclosure. The solid-state imaging apparatus 1 includes a pixel array section 10 serving as an imaging section, a row selection circuit 20 serving as a pixel drive section, a horizontal transfer scanning circuit 30, and a timing control circuit 40. The solid-state imaging apparatus 1 also includes an AD conversion section 50, a digital analog converter (DAC) 60 serving as a ramp signal generator, a horizontal transfer line 70, an amplifier (S/A) 80, and a signal processing circuit 90.

The pixel array section 10 is configured of pixels (pixel circuits) that are arranged in matrix. Each of the pixels may include, for example, a photoelectric conversion element such as a photodiode (PD) and an in-pixel amplifier.

Figure 2:
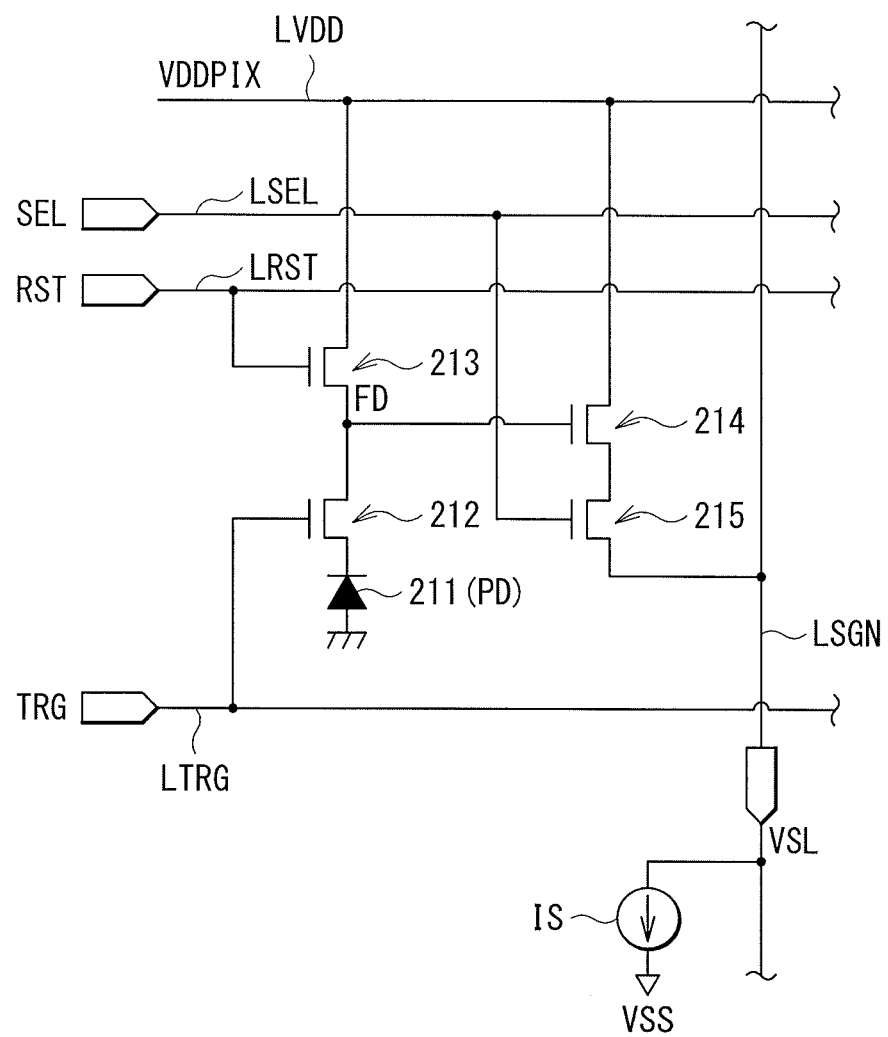
FIG. 2 is a circuit diagram illustrating an example of a pixel circuit of a pixel array section illustrated in FIG. 1.

FIG. 2 is a diagram illustrating an example of the pixel circuit. For example, the pixel circuit may include a photoelectric conversion element 211, and four transistors of a transfer transistor 212, a reset transistor 213, an amplification transistor 214, and a selection transistor 215 as active elements.

The photoelectric conversion element 211 is an element that converts incident light into charges (for example, electrons) of an amount corresponding to a quantity of the light, and may include, for example, a photodiode.

The transfer transistor 212 is coupled between the photoelectric conversion element 211 and a floating diffusion FD serving as an input node. A gate (a transfer gate) of the transfer transistor 212 is coupled with a transfer control line LTRG. A predetermined control signal (a transfer signal TRG) is provided to the gate of the transfer transistor 212 through the transfer control line LTRG. The electrons photoelectrically converted by the photoelectric conversion element 211 are transferred to the floating diffusion FD by the transfer transistor 212.

The reset transistor 213 is coupled between the floating diffusion FD and a power line LVDD) through which a power voltage VDD is supplied, and a reset signal RST that is a control signal is provided to a gate of the reset transistor 213 through a reset control line LRST. The potential of the floating diffusion FD is reset to the potential of the power line LVDD by the reset transistor 213

The floating diffusion FD is coupled with a gate of the amplification transistor 214. In other words, the floating diffusion FD functions as an input node of the amplification transistor 214.

The amplification transistor 214 and the selection transistor 215 are coupled in series with each other between the power line LVDD and a perpendicular signal line LSGN. The amplification transistor 214 is coupled with the perpendicular signal line LSGN through the selection transistor 215, and configures, together with a constant current source IS outside the pixel array section 10, a source follower. A selection signal SEL that is a control signal corresponding to an address signal is provided to a gate of the selection transistor 215 through a selection control line LSEL, thereby turning on the selection transistor 215. When the selection transistor 215 is turned on, the amplification transistor 214 amplifies the potential of the floating diffusion FD, and supplies a voltage corresponding to the potential, to the perpendicular signal line LSGN. The voltage supplied from each of the pixels is provided to the AD conversion section 50 through the perpendicular signal line LSGN.

The reset control line LRST, the transfer control line LTRG, and the selection control line LSEL that are wired in the pixel array section 10 are wired for each row unit of the pixel array. The reset control line LRST, the transfer control line LTRG, and the selection control line LSEL are coupled with the row selection circuit 20.

The row selection circuit 20 may include, for example, an unillustrated shift register circuit and an unillustrated predetermined logic circuit, and controls operation of the pixels arranged on each row of the pixel array section 10 through the control lines (the reset control line LRST, the transfer control line LTRG, and the selection control line LSEL). The row selection circuit 20 may perform image drive control by so-called a rolling shutter method (a line sequential driving method) or a global shutter method (a face collective driving method), for example, according to a driving method of an unillustrated exposure shutter.

The horizontal transfer scanning circuit 30 may include, for example, an unillustrated shift register circuit and an unillustrated address decoder, and transfers the AD converted signals of the respective pixel rows to the signal processing circuit 90 through the horizontal transfer line 70.

The timing control circuit 40 controls operation of the row selection circuit 20, the horizontal transfer scanning circuit 30, the AD conversion section 50, and the DAC 60. More specifically, the timing control circuit 40 includes a timing generator that generates various kinds of timing signals (control signals), and performs drive control of the row selection circuit 20, the horizontal transfer scanning circuit 30, the AD conversion section 50, and the DAC 60, based on the various kinds of timing signals.

(AD Conversion Section 50)

The AD conversion section 50 is a column-parallel AD conversion section, and includes a plurality of ADCs 50A that are each arranged (in columns) along a column direction of the pixel array. Each of the ADCs 50A may be a so-called single slope ADC that includes a comparator 51, a counter 52, and a latch 53, for example. Each of the ADCs 50A may have, for example, an n-bit digital signal conversion function, and is disposed for each perpendicular signal line LGSN.

The comparator 51 is a differential circuit that compares a reference voltage generated by the DAC 60 (a reference voltage Vslop (a RAMP signal) having RAMP waveform) with an analog signal supplied from the pixels for each row through the perpendicular signal line LSGN.

Figure 3:
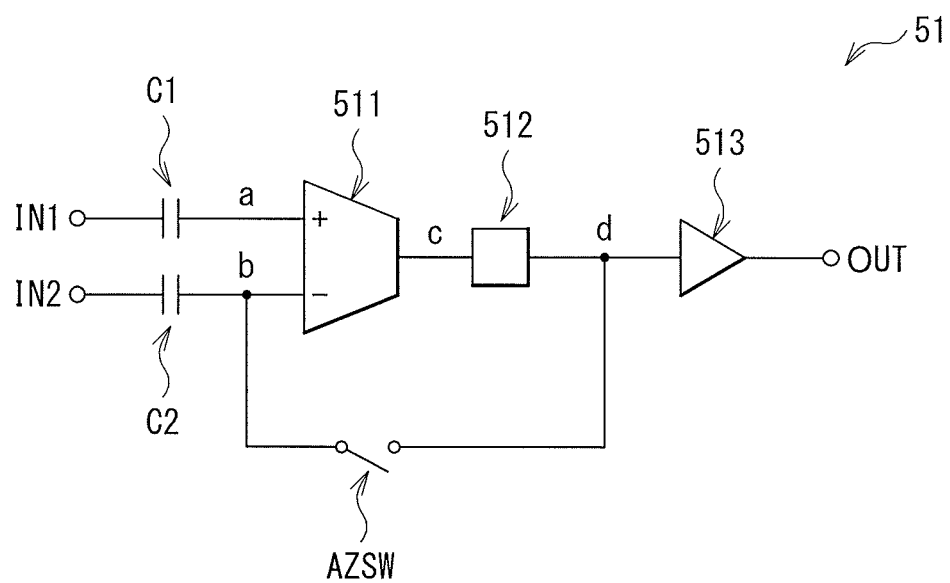
FIG. 3 is a circuit diagram illustrating a configuration example of a comparator illustrated in FIG. 1.

FIG. 3 is a diagram illustrating a configuration example of the comparator 51. The comparator 51 includes sampling capacitances (sampling capacitances C1 and C2) at respective paired differential input ends. More specifically, the comparator 51 may include, for example, a first amplifier 511, an isolator 512, a second amplifier 513, and an automatic zeroing switch AZSW. The sampling capacitance C1 is coupled in series with one (node a) of input ends of the first amplifier 511, and the sampling capacitance C2 is coupled in series with the other input end (node b). Note that the specific configurations of the sampling capacitances C1 and C2 are described later.

The first amplifier 511 includes a transconductance (Gm) amplifier. The isolator 512 is disposed to be coupled with an output end (node c) of the first amplifier 511 and has a function of suppressing voltage fluctuation. More specifically, the isolator 512 is so configured as to separate the voltage of the node c from node d of a large amplitude voltage and to maintain the voltage of the node c constant as much as possible. The second amplifier 513 is provided at an output stage of the comparator 51. Note that two or more amplifiers may be provided at the output stage of the comparator 51. The automatic zeroing switch AZSW is coupled between the node d on the output side of the isolator 512 and the node b of the high impedance.

The counter 52 is a circuit section that counts a comparison time of the comparator 51. An output of each latch 53 may be coupled with, for example, the horizontal transfer line 70 having 2n-bit width. The signal supplied to the horizontal transfer line 70 is provided to the signal processing circuit 90 through the amplifier 80.

The pixel circuits, the row selection circuit 20, the horizontal transfer scanning circuit 30, the timing control circuit 40, the AD conversion section 50, the DAC 60, the horizontal transfer line 70, the amplifier 80, and the signal processing circuit 90 mentioned above are provided on an unillustrated semiconductor substrate. These circuits may be configured by coupling, for example, a photodiode, two or more MOSFETs having different gate insulation film thickness, a bipolar transistor, a resistor, and a capacitor with one another on the semiconductor substrate through multilayer wiring. These circuits may be formed on the semiconductor substrate through a typical CMOS process. In the following, the layout of the sampling capacitances according to a present embodiment is described.

(Layout Configuration of Sampling Capacitances)

As mentioned above, in the column-parallel AD conversion section 50, two sampling capacitances C1 and C2 are disposed at the respective differential input ends of the comparator 51 of each ADC 50A. The specific layout configuration of the sampling capacitances C1 and C2 is described below.

Figure 4:
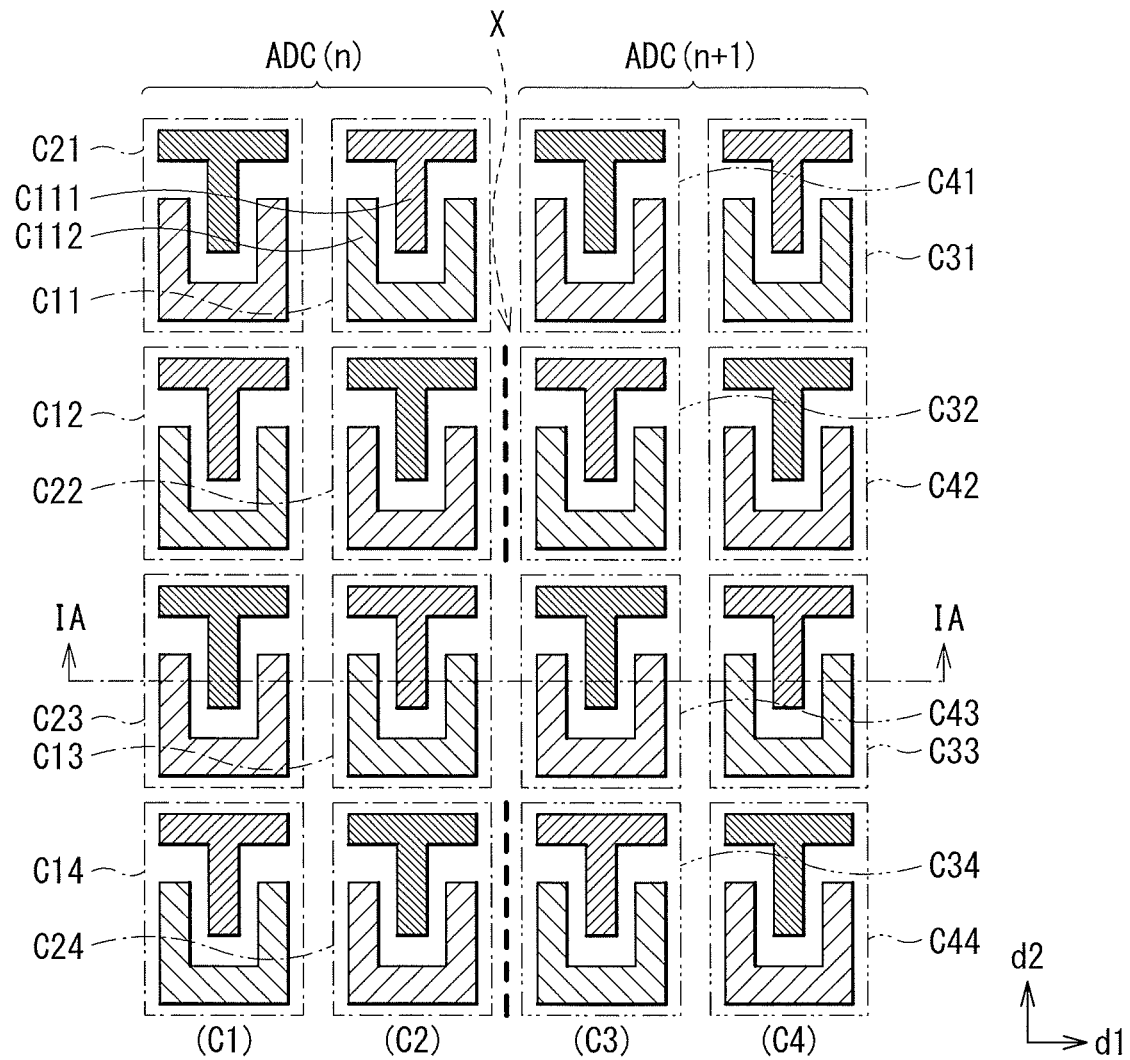
FIG. 4 is a schematic diagram illustrating an outline of layout of sampling capacitances illustrated in FIG. 3.

FIG. 4 is a diagram illustrating an outline of layout of sampling capacitances (C1 and C2) that are disposed in an ADC(n) on a certain column of the plurality of ADCs 50A and sampling capacitances (denoted by "C3" and "C4" for convenience) that are disposed in an ADC(n+1) adjacent to the ADC(n). The sampling capacitances C1 and C3 are coupled in series with the input terminal on DAC side of the comparator 51 (a terminal to which the reference voltage (Vslop) is provided from the DAC 60). The sampling capacitances C2 and C4 are coupled in series with an input terminal on VSL side of the comparator 51 (a terminal to which the analog signal supplied for each pixel row through the perpendicular signal line LSGN is provided).

As illustrated, in the present embodiment, each of the sampling capacitances C1 and C2 is divided into a plurality of sub-capacitances. More specifically, in the ADC(n), the sampling capacitance C1 includes a plurality of (four, in this case) sub-capacitances C11, C12, C13, and C14 that are coupled side by side with one another. The sampling capacitance C2 includes a plurality of (four, in this case) sub-capacitances C21, C22, C23, and C24 that are coupled side by side with one another. Likewise, in the ADC(n+1), the sampling capacitance C3 corresponds to the sampling capacitance C1, and includes four sub-capacitances C31, C32, C33, and C34 that are coupled side by side with one another. The sampling capacitance C4 corresponds to the sampling capacitance C2, and includes four sub-capacitances C41, C42, C43, and C44 that are coupled side by side with one another. Note that the sub-capacitances C31 to C34 and C41 to C44 are reference numerals assigned for description, and are arranged in layout equivalent to the layout of the sub-capacitances C11 to C14 and C21 to C24.

In other words, the sampling capacitance C1 corresponds to a combined capacitance of the sub-capacitances C11 to C14, and has a capacitance value that is a sum of capacitance values of the respective sub-capacitances C11 to C14. The sampling capacitance C2 corresponds to a combined capacitance of the sub-capacitances C21 to C24, and has a capacitance value that is a sum of capacitance values of the respective sub-capacitances C21 to C24.

Note that the sampling capacitances C1 and C2 respectively correspond to a specific but non-limiting example of a "first capacitor" and a "second capacitor" in one embodiment of the disclosure. Also, the sub-capacitances C11 to C14 and the sub-capacitances C21 to C24 respectively correspond to a specific but non-limiting example of "first sub-capacitors" and "second sub-capacitors" in one embodiment of the disclosure.

In the present embodiment, the four sub-capacitances C11 to C14 that configure the sampling capacitance C1 and the four sub-capacitances C21 to C24 that configure the sampling capacitance C2 are arranged in a plurality of columns (two columns in this case). Also, in each column, the sub-capacitances C11 to C14 and the sub-capacitances C21 to C24 are mixedly arranged. More specifically, the sub-capacitances C11 to C14 and the sub-capacitances C21 to C24 are each so arranged as not to form a straight line (linearly) but to meander (in a zigzag manner) in a planar view (in a plane direction).

More specifically, in two columns of the ADC(n), the sub-capacitances C11 to C14 and the sub-capacitances C21 to C24 are arranged to alternate with each other (alternately). In other words, any of the sub-capacitances C11 to C14 and any of the sub-capacitances C21 to C24 are so arranged as to be adjacent to each other in a row direction d1 or in a column direction d2. The sub-capacitances C11 to C14 and the sub-capacitances C21 to C24, however, may not be necessarily arranged alternately (at every other sub-capacitance). The arrangement and the shapes of the sub-capacitances may be departed from the above-described example as long as unevenness of the capacitances between the sampling capacitances C1 and C2 is allowed.

Each of the sub-capacitances C11 to C14 and C21 to C24 may have, for example, paired electroconductive layers (wiring layers). For example, in the sub-capacitance C11, paired comb-shaped electroconductive layers c111 and c112 are so oppositely disposed as to engage with each other. A dielectric film (not illustrated) such as an interlayer insulation film is disposed between the electroconductive layers c111 and c112. The capacitance value of the sub-capacitance C11 is designed depending on, for example, a facing area and a distance between the electroconductive layers c111 and c112. Likewise, each of other sub-capacitances C12 to C14 and C21 to C24 also has paired comb-shaped electroconductive layers. The capacitance values of the respective sub-capacitances C12 to C14 and C21 to C24 may be designed to be equivalent to one another.

Figure 5:
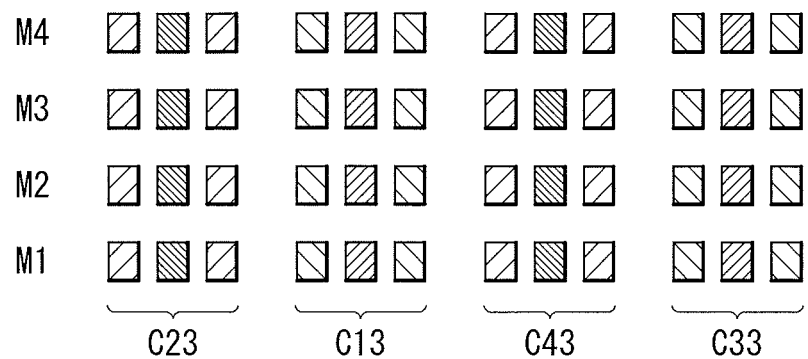
FIG. 5 is a cross-sectional diagram as viewed in an arrow direction of line IA-IA in FIG. 4.

FIG. 5 is a diagram schematically illustrating a cross-sectional configuration as viewed in an arrow direction of line IA-IA in FIG. 4. Each of the sub-capacitances C11 to C14 and C21 to C24 includes the paired electroconductive layers c111 and c112, and the electroconductive layers c111 and c112 may be formed through interlayer coupling (through coupling with each other through an unillustrated via), for example, in two or more layers. More specifically, the electroconductive layers c111 and c112 are formed with use of two or more wiring layers that are stacked with an interlayer insulating film in between. In this case, the electroconductive layers c111 and c112 are formed with use of four wiring layers M1 to M4. In other words, the sub-capacitances C11 to C14 and C21 to C24 are formed throughout the wiring layers M1 to M4. The electroconductive layers c111 and c112 of each of the sub-capacitances C11 to C14 and C21 to C24 face each other in each of the wiring layers M1 to M4.

The sub-capacitances C11 to C14 may desirably have the layout that is mirror-inverted to the layout of the sub-capacitances C21 to C24, in order to equalize the capacitance values of the respective sub-capacitances C11 to C14 and the capacitance values of the respective sub-capacitances C21 to C24 and to eliminate unevenness of the capacitance values between the sampling capacitances C1 and C2.

[Effects]

In the solid-state imaging apparatus 1 according to the present embodiment, when light enters the pixel array section 10, the incident light is received by the photoelectric conversion element 211 in each pixel and is photoelectrically converted. A signal charge generated by the photoelectric conversion element 211 is transferred to the floating diffusion FD by the transfer transistor 212. Thereafter, when the selection transistor 215 is turned on, the potential of the floating diffusion FD is amplified by the amplification transistor 214 and the voltage corresponding to the potential is supplied to the perpendicular signal line LSGN. The voltage supplied from each pixel through the perpendicular signal line LSGN is provided to the AD conversion section 50. In the AD conversion section 50, a signal for one pixel row is provided to the ADC 50A in the corresponding column, and is subjected to the AD conversion. The AD-converted signal is transmitted to the horizontal transfer line 70, and is provided to the signal processing circuit 90 through the amplifier 80.

In this case, in the AD conversion section 50, the ADCs 50A are arranged side by side for each pixel column. The comparator 51 is provided in each of the ADCs 50A, and the sampling capacitances C1 and C2 are disposed at the respective paired differential input ends of the comparator 51. Effects by the layout of the sampling capacitances C1 and C2 are described below.

One of important performance indices of the ADC conversion section 50 lies in crosstalk characteristics of a signal. In the column-parallel AD conversion section 50, crosstalk characteristics between the comparators 51 of the respective ADCs 50A influence crosstalk characteristics of the entire AD conversion section 50. One of factors deteriorating the crosstalk characteristics between the adjacent comparators 51 is a parasitic capacitance (a coupling capacitance) occurring between the adjacent comparators 51.

Figure 6:
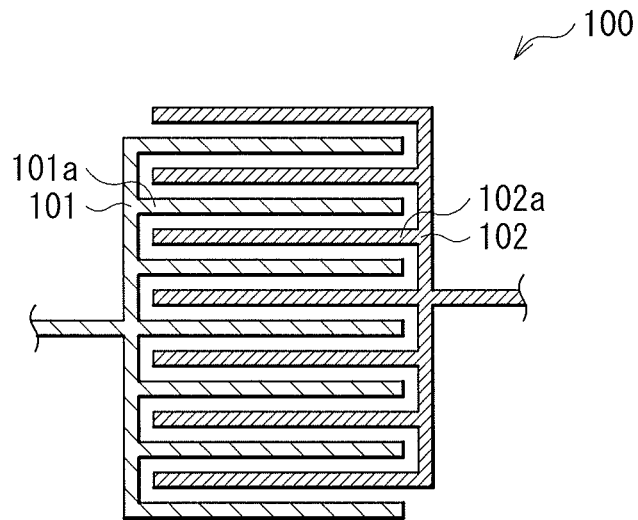
FIG. 6 is a schematic diagram illustrating layout of a sampling capacitance according to a comparative example.

Here, as a comparative example, a configuration is described, in which, in the column-parallel ADC, the sampling capacitance configuring a portion of the comparator is replaced with, for example, a comb-shaped wiring capacitor illustrated in FIG. 6. In the comparative example, a sampling capacitance 100 is configured of paired comb-shaped electroconductive layers 101 and 102. The electroconductive layers 101 and 102 respectively include a plurality of comb teeth 101a and a plurality of comb teeth 102a that are so arranged alternately as to engage with each other. This makes it possible to increase a facing area between the electroconductive layers 101 and 102 and to secure a capacitance value equal to or larger than a certain value.

Figure 7:
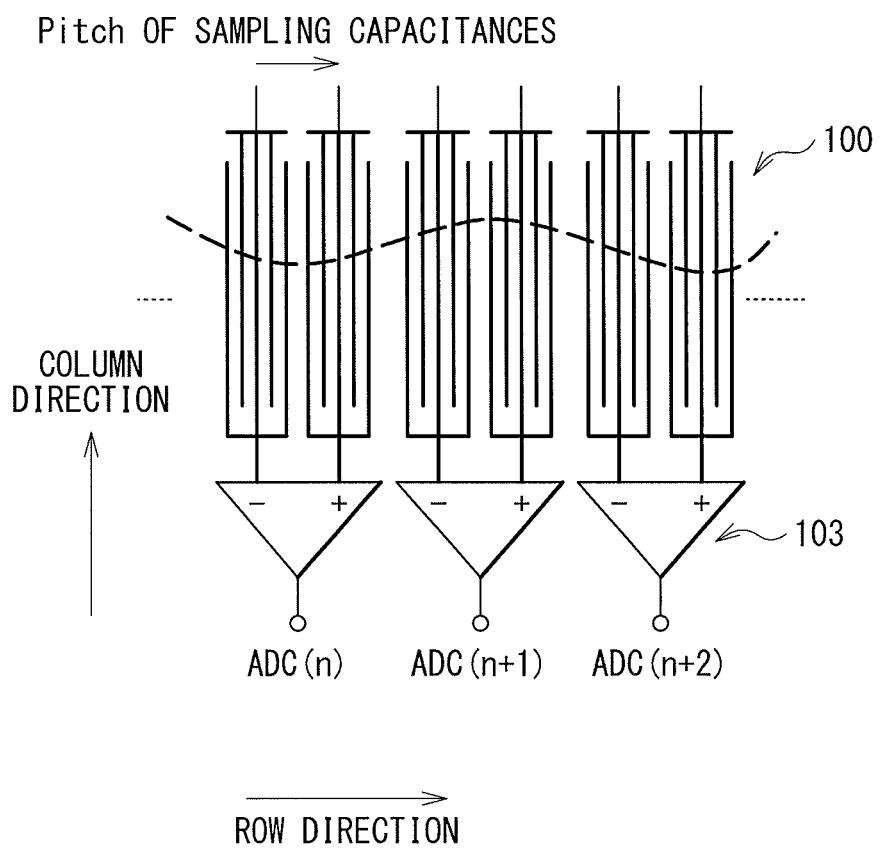
FIG. 7 is a schematic diagram illustrating a state in which the sampling capacitance illustrated in FIG. 6 is used in a column-parallel AD conversion section.

When such a sampling capacitance 100 is used in the column-parallel ADC, however, an arrangement space is restricted. Thus, to secure the capacitance value equal to or larger than the certain value, the layout extends long in a column direction, for example, as illustrated in FIG. 7. For example, when the above-described comb-shaped wiring capacitor is formed with use of four wiring layers and the wiring space is designed with a minimum value of a process rule in the CMOS process having a process rule of 45 nm, the capacitance value per unit area may be about 2.5 fF/µm². When the comb-shaped wiring capacitor having the structure is used, if the capacitance value of about 250 fF is necessary for one sampling capacitance, the sampling capacitance 100 is disposed with a pitch of about 2 µm whereas the pixel pitch is about 3 µm. As a result, the length of the sampling capacitance 100 in the column direction may be, for example, about 150 µm, which results in layout in which rectangular comb-shaped wiring capacitors each extremely elongated in the column direction are arranged in the row direction. Such layout is not practical.

Figure 8:
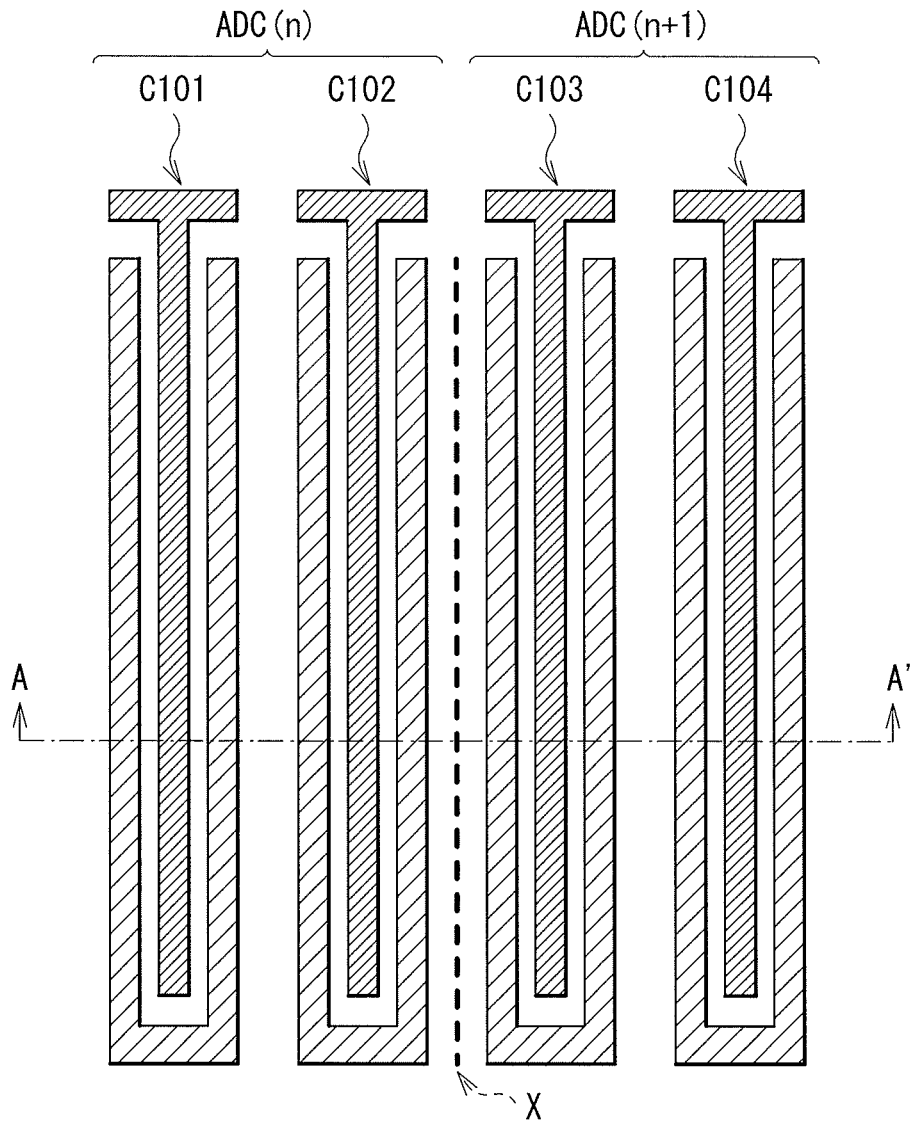
FIG. 8 is a schematic diagram illustrating an outline configuration of the sampling capacitance illustrated in FIG. 6.
Figure 9:
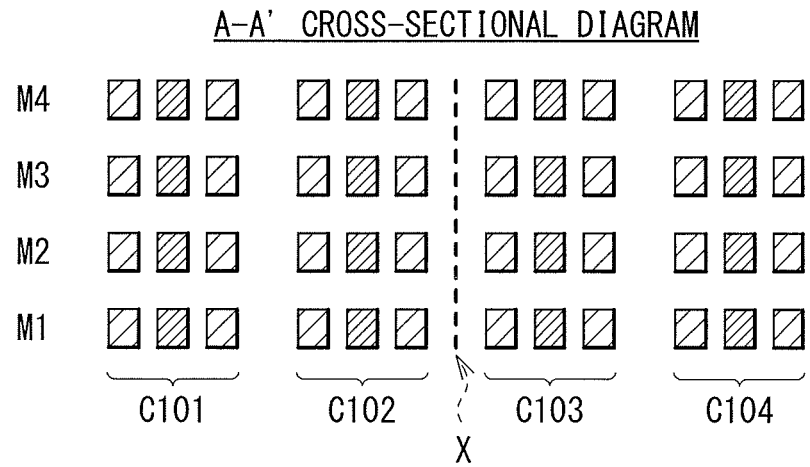
FIG. 9 is a cross-sectional diagram as viewed in an arrow direction of line A'-A' in FIG. 8.

Also, as illustrated in FIG. 8 and FIG. 9, in the above-described comb-shaped wiring capacitor, sampling capacitances C101 and C102 that are disposed in an ADC(n) and sampling capacitances C103 and C104 that are disposed in an ADC(n+1) adjacent to the ADC(n) are disposed in proximity to each other. Thus, the sampling capacitance C102 and the sampling capacitance C103 are disposed to face each other between the ADC(n) and the ADC(n+1), and the facing area therebetween (a dashed part X) is increased. As a result, the parasitic capacitance between the adjacent ADCs is increased, which causes deterioration of the crosstalk characteristics of the signal.

In addition, in recent years, the size reduction of the pixel size is progressed, for example, and a column pitch, namely, the distance between the adjacent ADCs tends to be further decreased (shortened). When the column pitch of the ADCs is decreased, the distance between the two comparators of the ADCs in the adjacent columns is also decreased. This causes the above-described parasitic capacitance between the sampling capacitances to be increased, and the crosstalk characteristics are easily deteriorated accordingly.

In contrast, in the present embodiment, the sampling capacitances C1 and C2 provided at the respective differential input ends of the comparator 51 of each of the ADCs 50A respectively include the plurality of sub-capacitances C11 to C14 and C21 to C24 that are coupled side by side with one another. The plurality of sub-capacitances C11 to C14 and C21 to C24 are disposed in two columns while being mixed in each column. For example, the plurality of sub-capacitances C11 to C14 and C21 to C24 may be alternately disposed in a zigzag manner in two columns. This reduces the facing area (the dashed part X) between the sampling capacitances C2 and (C3 to about a half of the facing area compared with the case where the sampling capacitances are so arranged to extend linearly in the column direction as with the above-described comparative example. Also, flexibility of the layout of the sampling capacitances C1 and C2 is enhanced.

Figure 10:
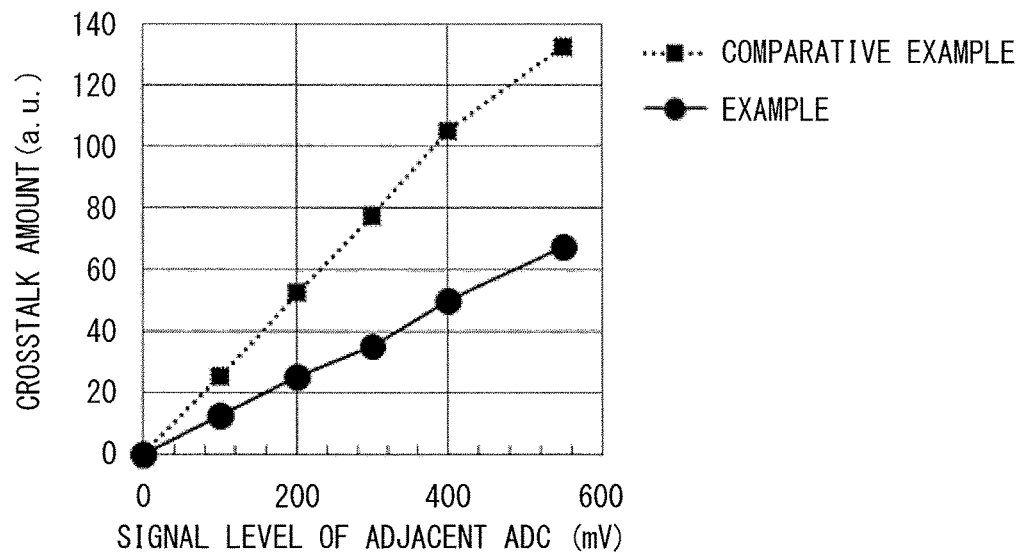
FIG. 10 is a characteristic diagram illustrating a crosstalk amount of a signal in each of Example and the comparative example.

Accordingly, the parasitic capacitance between the adjacent ADCs 50A is reduced, which makes it possible to improve deterioration of the crosstalk characteristics of the signal without increase in the pixel pitch, For example, as illustrated in a simulation result of FIG. 10, in Example using the above-described sampling capacitances C1 and C2, a crosstalk amount is reduced to about a half of the crosstalk amount of the comparative example using the sampling capacitance 100. Note that the abscissa in the characteristic diagram of FIG. 10 indicates a level of a signal supplied to the sampling capacitance C3 of the ADC(n+1), and the ordinate indicates a standardized value of a signal amount detected in the sampling capacitance C2 of the ADC(n).

Also, the mirror-inverted layout between the sub-capacitances C11 to C14 and the sub-capacitances C21 to C24 provides the following advantages. Since the sub-capacitances C11 to C14 (C21 to C24) are disposed separately (discretely) from one another in the sampling capacitance C1 (C2), film thickness gradient of each wiring (of the electroconductive layers c111 and c112) may be varied. Even in such a case, the combined capacitance is easily equalized due to symmetric property between the sampling capacitances C1 and C2. Therefore, the capacitance variation is reduced and reduction of the characteristic variation in the ADCs 50A for each column is expected, as compared with the comparative example.

Figure 11:
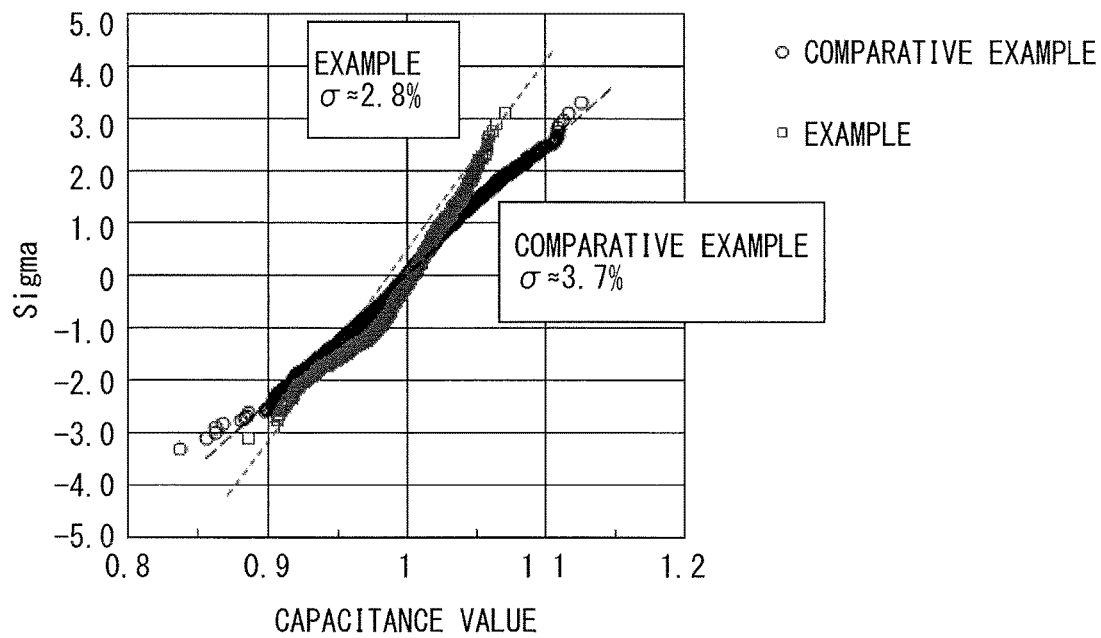
FIG. 11 is a characteristic diagram illustrating variation in a capacitance value of the sampling capacitance in each of Example and the comparative example.

FIG. 11 is a diagram illustrating the variation in the capacitance value of the sampling capacitances in the comparative example and Example. The capacitance values are measured data acquired from some prototype wafers. As compared with the comparative example, it was confirmed that the variation in the capacitance value was reduced by about 30% in Example.

As mentioned above, in the present embodiment, the sampling capacitances C1 and C2 provided at the respective differential input ends of the comparator 51 of each of the ADCs 50A respectively include the plurality of sub-capacitances C1 to C14 and C21 to C24 that are coupled side by side with one another. The plurality of sub-capacitances C11 to C14 and C21 to C24 are arranged in two columns while being mixed in each column. This makes it possible to reduce the facing area between the sampling capacitances C2 and C3. Thus, it is possible to suppress the crosstalk of the signal.

Accordingly, the solid-state imaging apparatus 1 includes the AD conversion section 50 that is configured of such an ADC 50A, which makes it possible to suppress deterioration of an image such as color mixture and brightness bleeding of a captured image, In the following, specific configuration examples of the sampling capacitances C1 and C2 described in the foregoing first embodiment are described.

<First Configuration Example>

Figure 12:
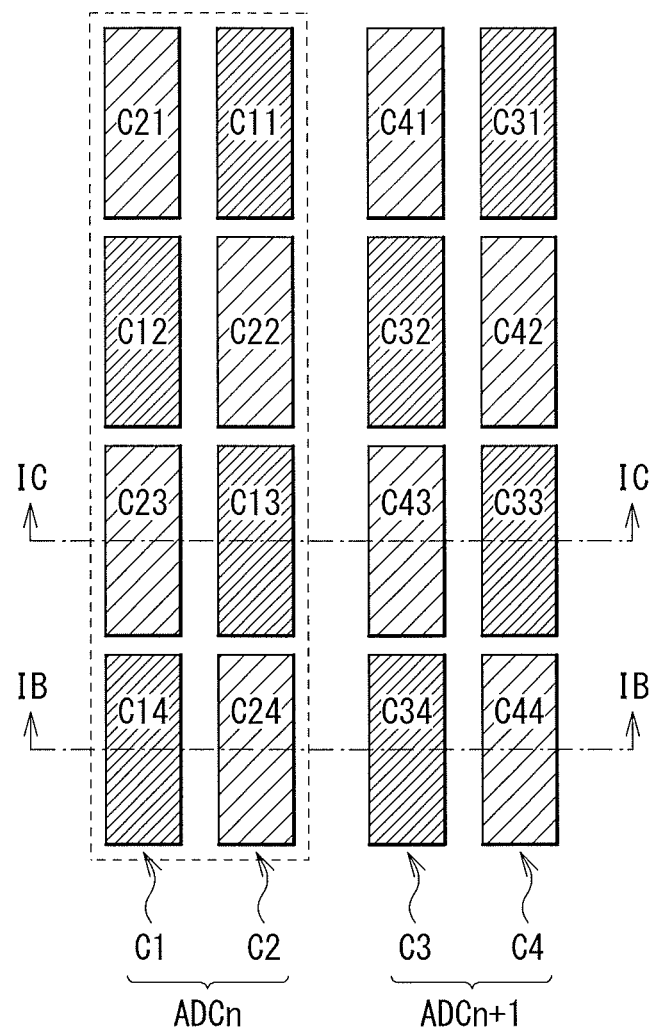
FIG. 12 is a schematic diagram to explain a first configuration example of the sampling capacitances illustrated in FIG. 3.
Figure 13:
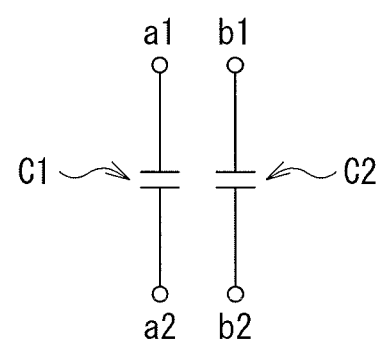
FIG. 13 is a circuit diagram to explain first and second sampling capacitances and ends for wiring coupling of the respective capacitances.
Figure 14:
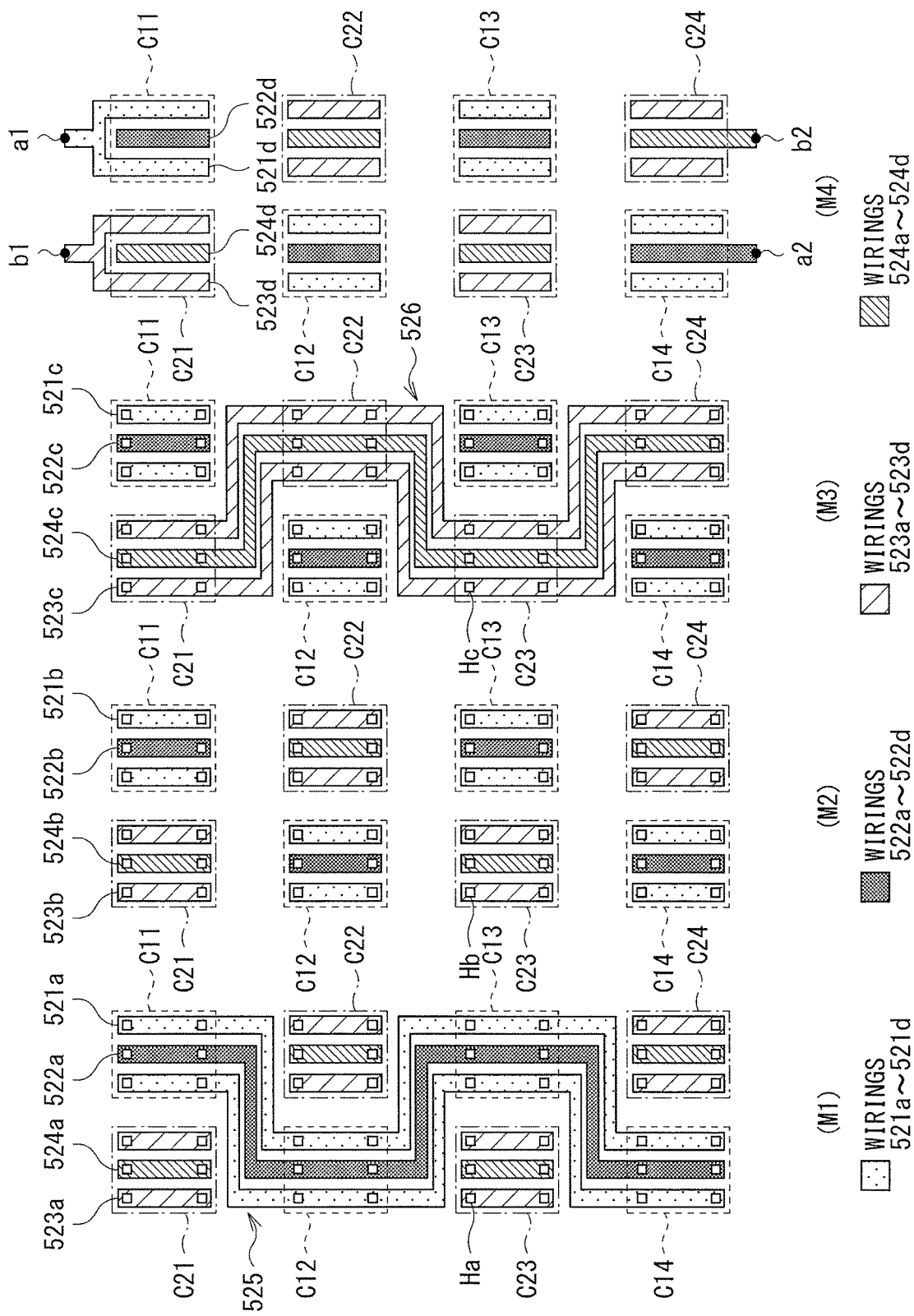
FIG. 14 is a schematic plan view illustrating wiring layout of each of a wiring layer (M1) to a wiring layer (M4) of the sampling capacitances according to the first configuration example.
Figure 15A:
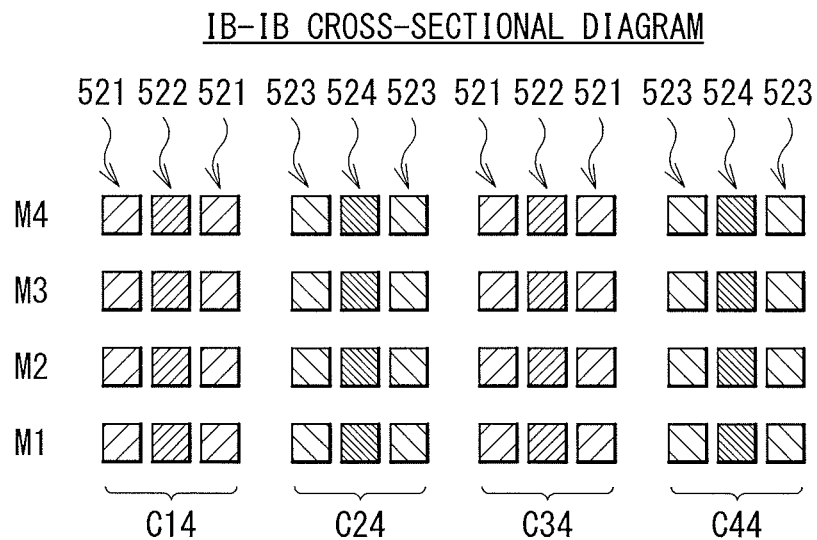
FIG. 15A is a cross-sectional diagram as viewed in an arrow direction corresponding to line IB-IB in FIG. 12 in the configuration example illustrated in FIG. 14.
Figure 15B:
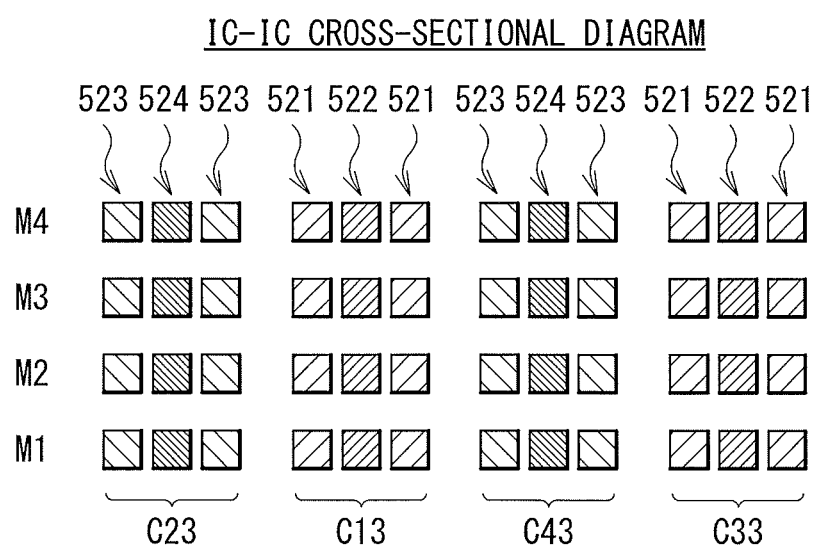
FIG. 15B is a cross-sectional diagram as viewed in an arrow direction corresponding to line IC-IC in FIG. 12 in the configuration example illustrated in FIG. 14.

FIG. 12 is a schematic diagram to explain the sampling capacitances C1 and C2 according to a first configuration example. FIG. 13 is a circuit diagram to explain ends for wiring coupling (extraction electrodes) of the sampling capacitances C1 and C2. FIG. 14 is a schematic plan view illustrating wiring layout of each of the wiring layer (M1) to the wiring layer (M4) of the sampling capacitances C1 and C2. FIG. 15A is a diagram illustrating a cross-sectional configuration as viewed in an arrow direction of line IB-IB in FIG. 12, and FIG. 15B is a diagram illustrating a cross-sectional configuration as viewed in an arrow direction of line IC-IC in FIG. 12.

Note that, FIG. 12 illustrates an outline of layout of sampling capacitances (C1 and C2) that are disposed in an ADC(n) in a certain column of the plurality of ADCs 50A and sampling capacitances (denoted by "C3" and "C4" for convenience) that are disposed in an ADC(n+1) adjacent to the ADC(n). As described in the foregoing first embodiment, the sampling capacitance C1 corresponds to the combined capacitance of the sub-capacitances C11 to C14, and the sampling capacitance C2 corresponds to the combined capacitance of the sub-capacitances C21 to C24. Also, the sub-capacitances C11 to C14 and the sub-capacitances C21 to C24 are arranged in two columns, and the sub-capacitances C11 to C14 and the sub-capacitances C21 to C24 are so disposed as to meander (in a zigzag manner).

The sampling capacitances C1 and C2 may be, for example, comb-shaped wiring capacitances that are each configured of two or more wiring layers provided on an unillustrated semiconductor substrate. Note that, FIG. 14 illustrates the wiring layout of only the sampling capacitances C1 and C2; however, the sampling capacitances C3 and C4 are also arranged in the layout similar to that of the sampling capacitances C1 and C2. For example, as illustrated in FIG. 14, FIG. 15A, and FIG. 15B, the sub-capacitances C11 to C14 and C21 to C24 may be formed with use of the four wiring layers M1 to M4. In this example, the positions of the respective sub-capacitances C11 to C14 and C21 to C24 are the same among the wiring layers M1 to M4 in a planar view (in a plane direction). In other words, the electroconductive layer disposed in each of the wiring layers M1 to M4 is coupled with the electroconductive layer right thereabove through interlayer coupling.

For example, each of the sub-capacitances C11 to C14 may include paired electroconductive layers 521 and 522 (FIG. 15A and FIG. 15B) that are disposed to face each other. The electroconductive layer 521 is configured through interlayer coupling of an electroconductive layer 521a of the wiring layer M1, an electroconductive layer 521b of the wiring layer M2, an electroconductive layer 521c of the wiring layer M3, and an electroconductive layer 521d of the wiring layer M4. The electroconductive layer 522 is configured through interlayer coupling of an electroconductive layer 522a of the wiring layer M1, an electroconductive layer 522b of the wiring layer M2, an electroconductive layer 522c of the wiring layer M3, and an electroconductive layer 522d of the wiring layer M4. The wiring layers M1 to M4 are electrically coupled with one another through vias Ha, Hb, and Hc Note that, in the wiring layers M1 to M4 of FIG. 14, portions configuring the sub-capacitances C11 to C14 are surrounded by dashed lines.

Likewise, each of the sub-capacitances C21 to C24 includes paired electroconductive layers 523 and 524 (FIG. 15A and FIG. 15B) that are disposed to face each other. The electroconductive layer 523 is configured through interlayer coupling of an electroconductive layer 523a of the wiring layer M1, an electroconductive layer 523b of the wiring layer M2, an electroconductive layer 523c of the wiring layer M3, and an electroconductive layer 523d of the wiring layer M4. The electroconductive layer 524 is configured through interlayer coupling of an electroconductive layer 524a of the wiring layer M1, an electroconductive layer 524b of the wiring layer M2, an electroconductive layer 524c of the wiring layer M3, and an electroconductive layer 524d of the wiring layer M4. The wiring layers M1 to M4 are electrically coupled with one another through the vias Ha, Hb, and Hc. Note that, in the wiring layers M1 to M4 of FIG. 14, portions configuring the sub-capacitances C21 to C24 are surrounded by alternate long and short dash lines.

The wiring layer 525 (the first wiring layer) to couple the sub-capacitances C11 to C14 side by side with one another is disposed in a layer different from a layer of the wiring layer 526 (the second wiring layer) to couple the sub-capacitances C21 to C24 side by side with one another. In this case, the wiring layer 525 is disposed in the wiring layer M1, and the wiring layer 526 is disposed in the wiring layer M3. In the wiring layer M1, the electroconductive layers 521a and 522a configuring the sub-capacitances C11 to C14 and the wiring layer 525 are integrally formed, and have a shape meandering in a rectangular wave shape in a planar view. Also, in the wiring layer M3, the electroconductive layers 523c and 524c configuring the sub-capacitances C21 to C24 and the wiring layer 526 are integrally formed, and have a shape meandering in a rectangular wave shape in a planar view. Note that the rectangular wave shape including the wiring layers 525 and 526 may be disposed in other layers without being limited to the wiring layers M1 and M3, or may be disposed in three or more layers.

In the wiring layer M4, portions of the electroconductive layers 521d, 522d, 523d, and 524d are extended as ends a1, a2, b1, and b2 (the extraction electrodes), respectively, illustrated in FIG. 13. More specifically, a portion of the electroconductive layer 521d configuring the sub-capacitance C1 serves as the end a1, and a portion of the electroconductive layer 522d configuring the sub-capacitance C14 serves as the end a2. A portion of the electroconductive layer 523d configuring the sub-capacitance C21 serves as the end b1, and a portion of the electroconductive layer 524d configuring the sub-capacitance C24 serves as the end b2, As mentioned above, it is possible to arrange the sub-capacitances C11 to C14 and the sub-capacitances C21 to C24 in a meandering layout in a planar view while being coupled side by side with one another with use of the four wiring layers M1 to M4.

<Modification Example of First Configuration Example>

In the above-described first configuration example, the sub-capacitances C11 to C14 and C21 to C24 are formed with use of the four wiring layers M1 to M4. The number of the wiring layers, however, is not limited to four, and two or more layers are sufficient. Also, the number of the wiring layers is not limited to an even number, and an odd number of layers may also be used. In addition, other layers may be interposed among the wiring layers. In this way, the combination of the wiring layers may be selected in various ways. As an example, a case where three wiring layers M1 to M3 are used is described in the present modification example.

Figure 16:
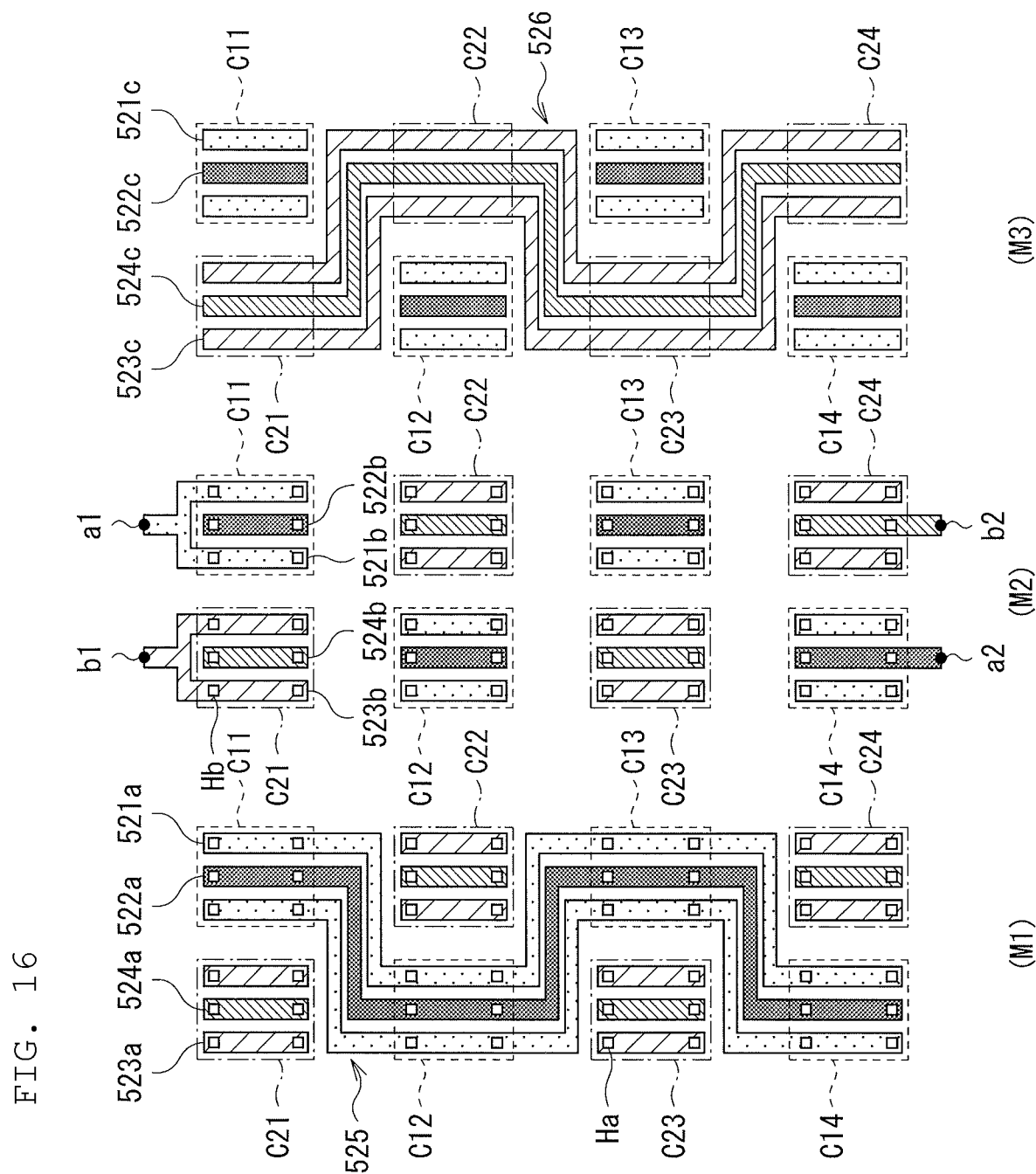
FIG. 16 is a schematic plan view illustrating wiring layout of each of a wiring layer (M1) to a wiring layer (M3) of sampling capacitances according to a modification example of the first configuration example.
Figure 17A:
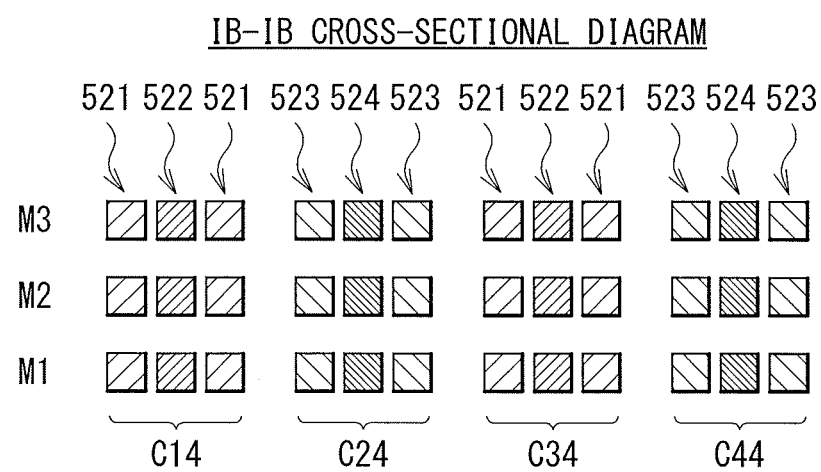
FIG. 17A is a cross-sectional diagram as viewed in an arrow direction corresponding to line IB-IB in FIG. 12 in the configuration example illustrated in FIG. 16.

FIG. 16 is a schematic plan view illustrating wiring layout of each of the wiring layer (M1) to the wiring layer (M3) of the sampling capacitances C1 and C2 according to the present modification example. FIG. 17A is a diagram illustrating a cross-sectional configuration as viewed in an arrow direction of line IB-IB of FIG. 12, and FIG. 15B is a diagram illustrating a cross-sectional configuration as viewed in an arrow direction of line IC-IC of FIG. 12.

Also in the present modification example, the sub-capacitances C11 to C14 and the sub-capacitances C21 to C24 are arranged in two columns, and the sub-capacitances C11 to C14 and the sub-capacitances C21 to C24 are so disposed as to meander (in a zigzag manner). Further, the sampling capacitances C1 and C2 may be, for example, comb-shaped wiring capacitances that are provided on an unillustrated semiconductor substrate. Note that, FIG. 16 illustrates the wiring layout of only the sampling capacitances C1 and C2; however, the sampling capacitances C3 and C4 are also disposed in the layout similar to that of the sampling capacitances C1 and C2.

In the present modification example, however, the sub-capacitances C11 to C14 and C21 to C24 are formed with use of the three wiring layers M1 to M3. Also in this modification example, the positions of the respective sub-capacitances C11 to C14 and C21 to C24 are the same among the wiring layers M1 to M3 in a planar view, as with the above-described first configuration example. In other words, the electroconductive layer disposed in each of the wiring layers M1 to M3 is coupled with the electroconductive layer right thereabove through interlayer coupling.

Figure 17B:
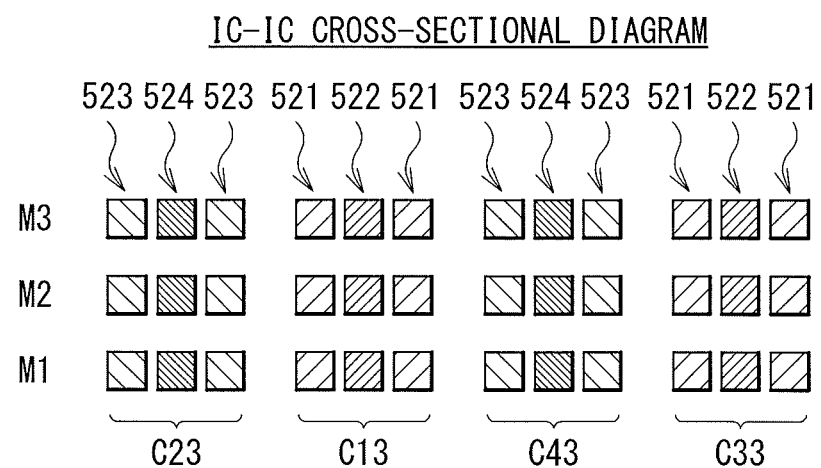
FIG. 17B is a cross-sectional diagram as viewed in an arrow direction corresponding to line IC-IC in FIG. 12 in the configuration example illustrated in FIG. 16.

For example, each of the sub-capacitances C11 to C14 may include the paired electroconductive layers 521 and 522 (FIG. 17A and FIG. 17B) that are disposed to face each other. The electroconductive layer 521 is configured through interlayer coupling of the electroconductive layer 521a of the wiring layer M1, the electroconductive layer 521b of the wiring layer M2, and the electroconductive layer 521c of the wiring layer M3. The electroconductive layer 522 is configured through interlayer coupling of the electroconductive layer 522a of the wiring layer M1, the electroconductive layer 522b of the wiring layer M2, and the electroconductive layer 522c of the wiring layer M3. The wiring layers M1 to M3 are electrically coupled with one another through the vias Ha and Hb. Note that, in the wiring layers M1 to M3 of FIG. 16, portions configuring the sub-capacitances C11 to C14 are surrounded by dashed lines.

Likewise, each of the sub-capacitances C21 to C24 includes the paired electroconductive layers 523 and 524 (FIG. 17A and FIG. 17B) that are disposed to face each other. The electroconductive layer 523 is configured through interlayer coupling of the electroconductive layer 523a of the wiring layer M1, the electroconductive layer 523b of the wiring layer M2, and the electroconductive layer 523c of the wiring layer M3. The electroconductive layer 524 is configured through interlayer coupling of the electroconductive layer 524a of the wiring layer M1, the electroconductive layer 524b of the wiring layer M2, and the electroconductive layer 524c of the wiring layer M3. The wiring layers M1 to M3 are electrically coupled with one another through the vias Ha and Hb. Note that, in the wiring layers M1 to M3 of FIG. 16, portions configuring the sub-capacitances C21 to C24 are surrounded by alternate long and short dash lines.

The wiring layer 525 (the first wiring layer) to couple the sub-capacitances C11 to C14 side by side with one another is disposed in a layer different from a layer of the wiring layer 526 (the second wiring layer) to couple the sub-capacitances C21 to C24 side by side with one another. In this case, the wiring layer 525 is disposed in the wiring layer M1, and the wiring layer 526 is disposed in the wiring layer M3. In the wiring layer M1, the electroconductive layers 521a and 522a configuring the sub-capacitances C11 to C14 and the wiring layer 525 are integrally formed, and have a shape meandering in a rectangular wave shape in a planar view. Also, in the wiring layer M3, the electroconductive layers 523c and 524c configuring the sub-capacitances C21 to C24 and the wiring layer 526 are integrally formed, and have a shape meandering in a rectangular wave shape in a planar view. Note that the rectangular wave shape including the wiring layers 525 and 526 may be disposed in other layers without being limited to the wiring layers M1 and M3, or may be disposed in all of the three layers.

In the wiring layer M2, portions of the electroconductive layers 521b, 522b, 523b, and 524b are extended as the ends a1, a2, b1, and b2, respectively, illustrated in FIG. 13. More specifically, a portion of the electroconductive layer 521b configuring the sub-capacitance C11 serves as the end a1, and a portion of the electroconductive layer 522b configuring the sub-capacitance C14 serves as the end a2. A portion of the electroconductive layer 523b configuring the sub-capacitance C21 serves as the end b1, and a portion of the electroconductive layer 524b configuring the sub-capacitance C24 serves as the end b2.

As mentioned above, it is possible to arrange the sub-capacitances C11 to C14 and the sub-capacitances C21 to C24 in the meandering layout in a planar view while being coupled side by side with one another with use of the three wiring layers M1 to M3.

Hereinafter, other embodiments of the above-described embodiment are described. Not that the components similar to those of the above-descried embodiment are denoted by the same reference numerals, and the description thereof is omitted.

<Second Embodiment>

Figure 18:
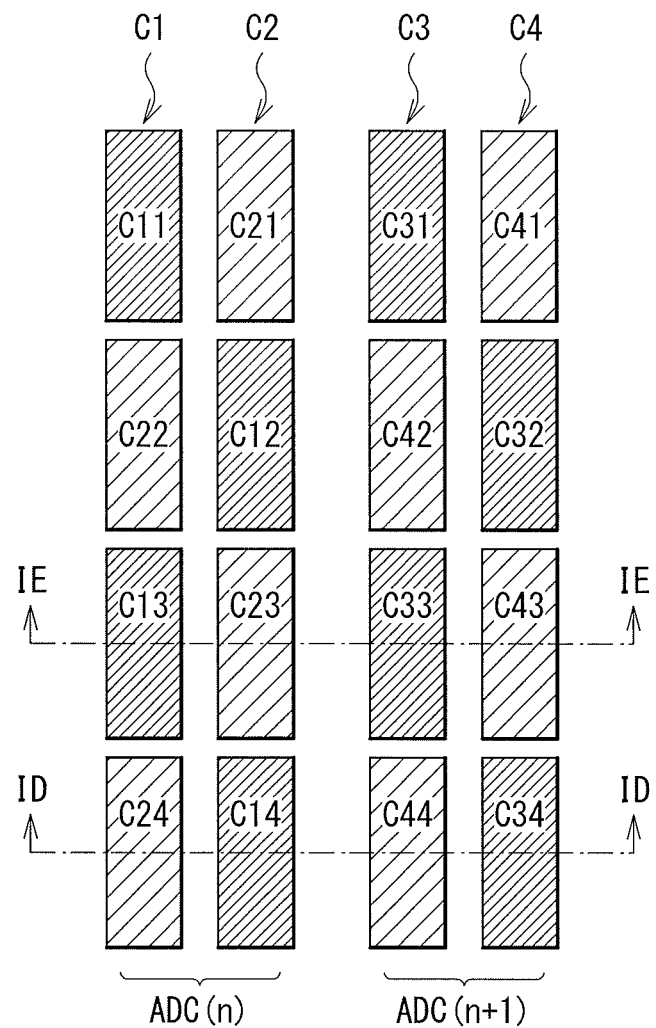
FIG. 18 is a schematic diagram illustrating an outline of layout of sampling capacitances according to a second embodiment of the disclosure.
Figure 19:
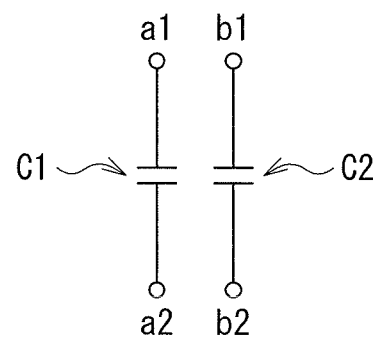
FIG. 19 is a circuit diagram to explain first and second sampling capacitances and ends for wiring coupling of the respective capacitances.
Figure 20:
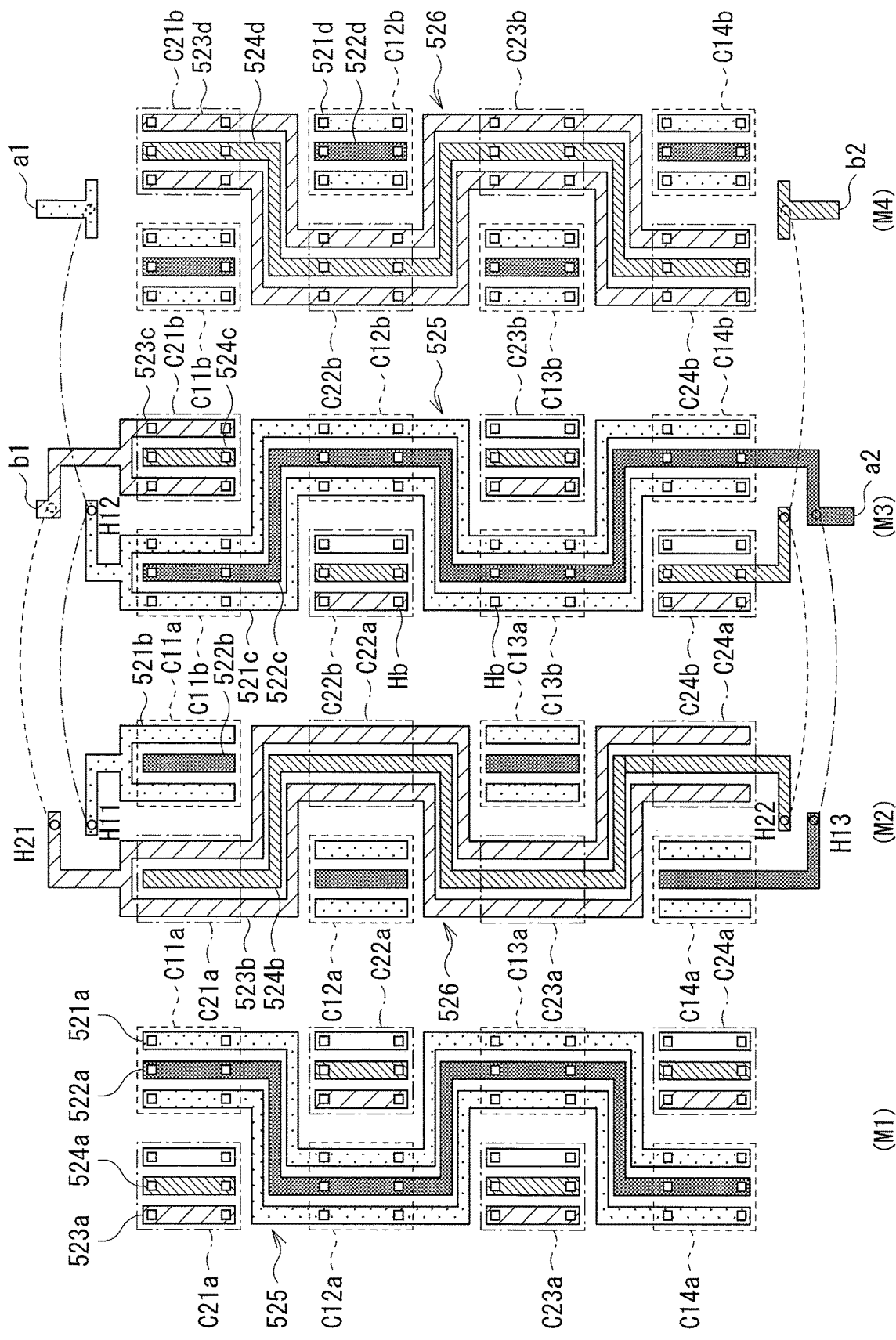
FIG. 20 is a schematic plan view illustrating wiring layout of each of a wiring layer (M1) to a wiring layer (M4) of sampling capacitances according to a second configuration example.
Figure 21A:
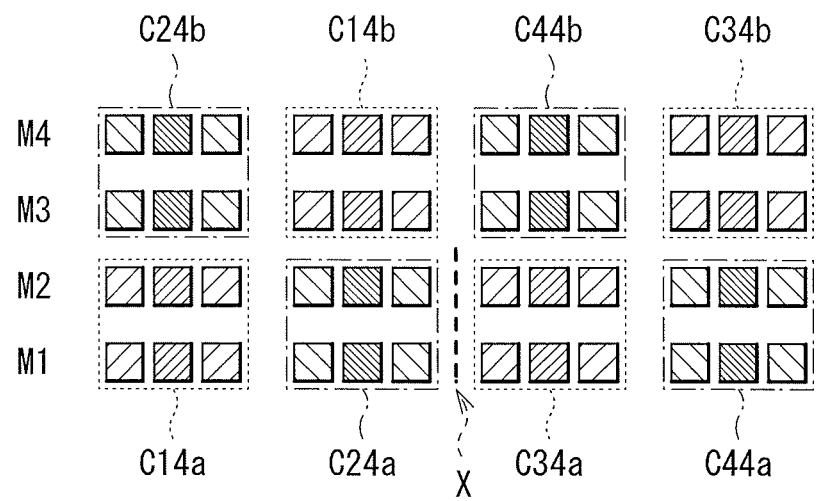
FIG. 21A is a cross-sectional diagram as viewed in an arrow direction corresponding to line ID-ID in FIG. 18.
Figure 21B:
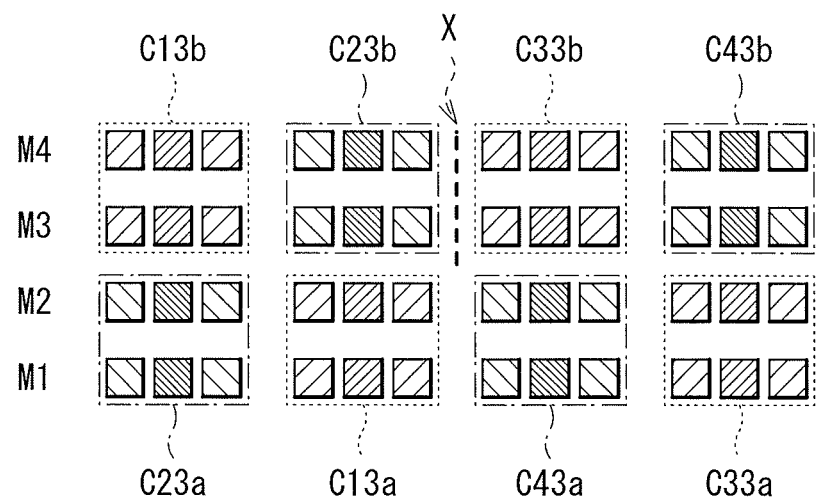
FIG. 21B is a cross-sectional diagram as viewed in an arrow direction corresponding to line IE-IE in FIG. 18.

FIG. 18 is a diagram illustrating an outline of layout of sampling capacitances according to a second embodiment of the disclosure. FIG. 19 is a circuit diagram to explain ends for wiring coupling (extraction electrodes) of the sampling capacitances C1 and C2. FIG. 20 is a schematic plan view illustrating wiring layout of each of the wiring layer (M1) to the wiring layer (M4) of the sampling capacitances C1 and C2 according to a second configuration example. FIG. 21A is a diagram illustrating a cross-sectional configuration as viewed in an arrow direction of line ID-ID in FIG. 18, and FIG. 21B is a diagram illustrating a cross-sectional configuration as viewed in an arrow direction of line IE-IE in FIG. 18.

Note that, FIG. 18 illustrates an outline of layout of sampling capacitances (C1 and C2) that are disposed in an ADC(n) in a certain column of the plurality of ADCs 50A and sampling capacitances (denoted by "C3" and "C4" for convenience) that are disposed in an ADC(n+1) adjacent to the ADC(n). As described in the foregoing first embodiment, the sampling capacitance C1 corresponds to the combined capacitance of the sub-capacitances C11 to C14, and the sampling capacitance C2 corresponds to the combined capacitance of the sub-capacitances C21 to C24.

Also, FIG. 20 illustrates the wiring layout of only the sampling capacitances C1 and C2; however, the sampling capacitances C3 and C4 (C31 to C34 and C41 to C44) are also arranged in the layout similar to that of the sampling capacitances C1 and C2.

The sampling capacitances C1 and C2 according to the present embodiment are disposed at respective paired differential input ends of the comparator 51 that is similar to that of the above-described first embodiment, and are suitably used in the ADC 50A or the AD conversion section 50 including the comparator 51. Also in the present embodiment, as illustrated in FIG. 20, FIG. 21A, and FIG. 21B, the sub-capacitances C11 to C14 and C21 to C24 are provided on an unillustrated semiconductor substrate with use of the four wiring layers M1 to M4, as with the above-described first embodiment. The sub-capacitances C11 to C14 and the sub-capacitances C21 to C24 are arranged in two columns, and the sub-capacitances C11 to C14 and the sub-capacitances C21 to C24 are so disposed as to meander (in a zigzag manner) in a planar view.

In the present embodiment, however, the sub-capacitances C11 to C14 and the sub-capacitances C21 to C24 are so arranged as to meander (in a zigzag manner) not only in the plane direction but also in a stacked-layer direction (in both the plane direction and the stacked-layer direction). The positions of the sub-capacitances C11 to C14 and the positions of the sub-capacitances C21 to C24 are inverted between adjacent two layers.

More specifically, each of the sub-capacitances C11 to C14 and C21 to C24 is divided into upper and lower sub-capacitances, and the divided upper and lower sub-capacitances are also coupled side by side with each other. In other words, the sub-capacitance C11 includes sub-capacitances C11a and C11b that are coupled side by side with each other. Likewise, the sub-capacitance C12 includes sub-capacitances C12a and C12b that are coupled side by side with each other, the sub-capacitance C13 includes sub-capacitances C13a and C13b that are coupled side by side with each other, and the sub-capacitance C14 includes sub-capacitances C14a and C14b that are coupled side by side with each other. Also, likewise, the sub-capacitance C21 includes sub-capacitances C21a and C21b that are coupled side by side with each other, the sub-capacitance C22 includes sub-capacitances C22a and C22b that are coupled side by side with each other, the sub-capacitance C23 includes sub-capacitances C23a and C23b that are coupled side by side with each other, and the sub-capacitance C24 includes sub-capacitances C24a and C24b that are coupled side by side with each other.

The sub-capacitances C11a to C14a and C21a to C24a are each disposed in the wiring layers M1 and M2. The sub-capacitances C11b to C14b and C21b to C24b are each disposed in the wiring layers M3 and M4. In such a stacked-layer structure, the sub-capacitances C11a and C11b configuring the sub-capacitance C11 are vertically disposed at shifted positions (are disposed at inverted positions in the plane direction). Likewise, the sub-capacitances C12a and C12b, the sub-capacitances C13a and C13b, the sub-capacitances C14a and C14b, the sub-capacitances C21a and C21b, the sub-capacitances C22a and C22b, the sub-capacitances C23a and C23b, and the sub-capacitances C24a and C24b respectively configuring the sub-capacitances C12 to C14 and C21 to c24 are vertically disposed at shifted positions.

For example, each of the sub-capacitances C11a to C14a may include the electroconductive layers 521a and 522a that are disposed in the wiring layer M1 and the electroconductive layers 521b and 522b that are disposed in the wiring layer M2. The electroconductive layer 521a disposed in the wiring layer M1 and the electroconductive layer 521b disposed in the wiring layer M2 right above the wiring layer M1 face each other, and are coupled with each other through the via Ha through interlayer coupling. Likewise, the electroconductive layer 522a disposed in the wiring layer M1 and the electroconductive layer 522b disposed in the wiring layer M2 right above the wiring layer M1 face each other, and are coupled with each other through the via Ha through interlayer coupling. Note that portions configuring the sub-capacitances C11a to C14a are surrounded by dashed lines in the wiring layers M1 and M2 of FIG. 20.

Each of the sub-capacitances C11b to C14b includes the electroconductive layers 521c and 522c that are disposed in the wiring layer M3 and the electroconductive layers 521d and 522d that are disposed in the wiring layer M4. The electroconductive layer 521c disposed in the wiring layer M3 and the electroconductive layer 521d disposed in the wiring layer M4 right above the wiring layer M3 face each other, and are coupled with each other through the via Hc through interlayer coupling. Likewise, the electroconductive layer 522c disposed in the wiring layer M3 and the electroconductive layer 522d disposed in the wiring layer M4 right above the wiring layer M3 face each other, and are coupled with each other through the via Hc through interlayer coupling. Note that portions configuring the sub-capacitances C11b to C14b are surrounded by dashed lines in the wiring layers M3 and M4 of FIG. 20.

In contrast, each of the sub-capacitances C21a to C24a may include the electroconductive layers 523a and 524a that are disposed in the wiring layer M1 and the electroconductive layers 523b and 524b that are disposed in the wiring layer M2. The electroconductive layer 523a disposed in the wiring layer M1 and the electroconductive layer 523b disposed in the wiring layer M2 right above the wiring layer M1 face each other, and are coupled with each other through the via Ha through interlayer coupling. Likewise, the electroconductive layer 524a disposed in the wiring layer M1 and the electroconductive layer 524b disposed in the wiring layer M2 right above the wiring layer M1 face each other, and are coupled with each other through the via Ha through interlayer coupling. Note that portions configuring the sub-capacitances C21a to C24a are surrounded by alternate long and short dash lines in the wiring layers M1 and M2 of FIG. 20.

Each of the sub-capacitances C21b to C24b includes the electroconductive layers 523c and 524c that are disposed in the wiring layer M3 and the electroconductive layers 523d and 524d that are disposed in the wiring layer M4. The electroconductive layer 523c disposed in the wiring layer M3 and the electroconductive layer 523d disposed in the wiring layer M4 right above the wiring layer M3 face each other, and are coupled with each other through the via Hc through interlayer coupling. Likewise, the electroconductive layer 524c disposed in the wiring layer M3 and the electroconductive layer 524d disposed in the wiring layer M4 right above the wiring layer M3 face each other, and are coupled with each other through the via Hc through interlayer coupling. Note that portions configuring the sub-capacitances C21b to C24b are surrounded by alternate long and short dash lines in the wiring layers M3 and M4 of FIG. 20.

The wiring layer 525 (the first wiring layer) to couple the sub-capacitances C11 to C14 with one another is disposed in a layer different from a layer of the wiring layer 526 (the second wiring layer) to couple the sub-capacitances C21 to C24 with one another. In this case, the wiring layer 525 is disposed in the wiring layers M1 and M3, and the wiring layer 526 is disposed in the wiring layers M2 and M4.

In the wiring layer M1, the electroconductive layers 521a and 522a configuring the sub-capacitances C11a to C14a and the wiring layer 525 are integrally formed, and have a shape meandering in a rectangular wave shape in a planar view. In the wiring layer M3, the electroconductive layers 521c and 522c configuring the sub-capacitances C11b to C14b and the wiring layer 525 are integrally formed, and have a shape meandering in a rectangular wave shape in a planar view. In the wiring layer M2, the electroconductive layers 523b and 524b configuring the sub-capacitances C21a to C24a and the wiring layer 526 are integrally formed, and have a shape meandering in a rectangular wave shape in a planar view. In the wiring layer M4, the electroconductive layers 523d and 524d configuring the sub-capacitances C21b to C24b and the wiring layer 526 are integrally formed, and have a shape meandering in a rectangular wave shape in a planar view.

Such a configuration results in layout in which the positions of the respective sub-capacitances C11a to C14a and C21a to C24a and the positions of the respective sub-capacitances C11b to C14b and C21b to C24b are inverted between the wiring layer M2 and the wiring layer M3. Thus, portions of the respective electroconductive layers 521b, 522b, 523b, and 524b and portions of the respective electroconductive layers 521c, 522c, 523c, and 524c are extended for interlayer coupling of the wiring layers M2 and M3.

A portion of the electroconductive layer 521b configuring the sub-capacitance C11a is extended, and a via H11 is provided in the extended portion. The electroconductive layer 521b and the electroconductive layer 521c are electrically coupled with each other through the via H11. A portion of the electroconductive layer 522b configuring the sub-capacitance C14a is extended, and a via H13 is provided in the extended portion. The electroconductive layer 522b and the electroconductive layer 522c are electrically coupled with each other through the via H13.

A portion of the electroconductive layer 523b configuring the sub-capacitance C21a is extended, and a via H21 is provided in the extended portion. The electroconductive layer 523b and the electroconductive layer 523c are electrically coupled with each other through the via H21. A portion of the electroconductive layer 524b configuring the sub-capacitance C24a is extended, and a via H22 is provided in the extended portion. The electroconductive layer 524b and the electroconductive layer 524c are electrically coupled with each other through the via H22.

In the wiring layers M3 and M4, portions of the electroconductive layers 521c, 522c, 523c, and 524c are extended as ends a1, a2, b1, and b2, respectively, illustrated in FIG. 19. More specifically, a portion of the electroconductive layer 521c configuring the sub-capacitance C11b is extended, and a via H12 is provided in the extended portion. The electroconductive layer 521c is led out to the wiring layer M4 through the via H12, thereby serving as the end a1. A portion of the electroconductive layer 522c configuring the sub-capacitance C14b serves as the end a2. A portion of the electroconductive layer 523c configuring the sub-capacitance C21b serves as the end b1. A portion of the electroconductive layer 524c configuring the sub-capacitance C24b is extended, and a via H23 is provided in the extended portion. The electroconductive layer 524c is led out to the wiring layer M4 through the via H23, thereby serving as the end b2.

As mentioned above, it is possible to arrange the sub-capacitances C11 to C14 and the sub-capacitances C21 to C24 in the layout meandering in a zigzag manner in both the plane direction and the stacked-layer direction while being coupled side by side with one another with use of the four wiring layers M1 to M4. Also, causing the arrangement of the sub-capacitances to meander in the stacked-layer direction makes it possible to further reduce the facing area between the sampling capacitances C2 and C3, thereby further reducing the crosstalk amount, as illustrated in FIG. 21A and FIG. 21b.

<Third Embodiment>

Figure 22:
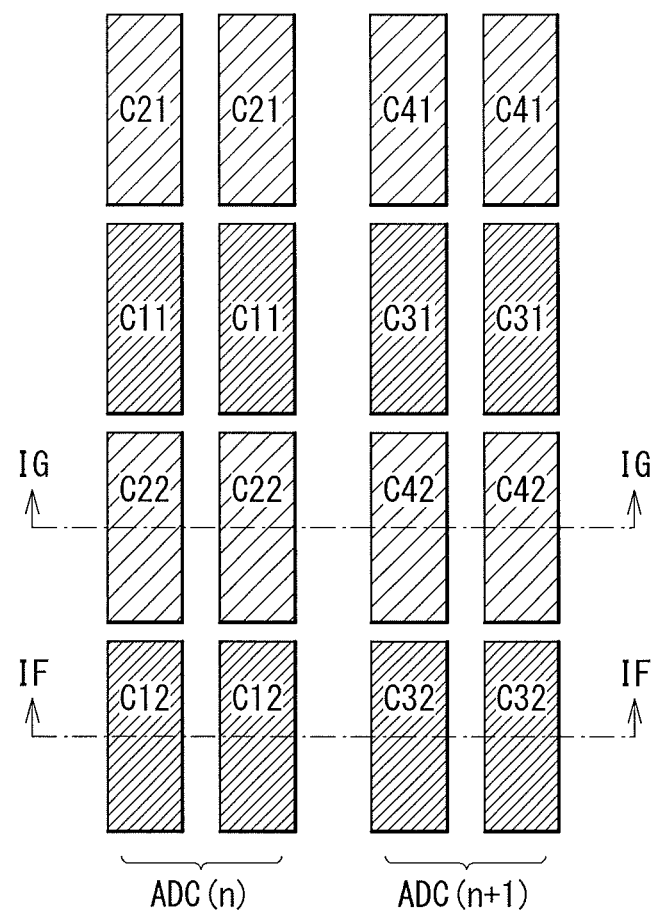
FIG. 22 is a schematic diagram illustrating an outline of layout of sampling capacitances according to a third embodiment of the disclosure.
Figure 23:
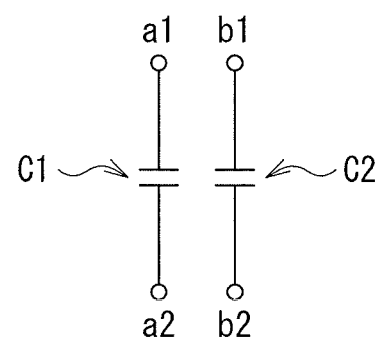
FIG. 23 is a circuit diagram to explain first and second sampling capacitances and ends for wiring coupling of the respective capacitances.
Figure 24:
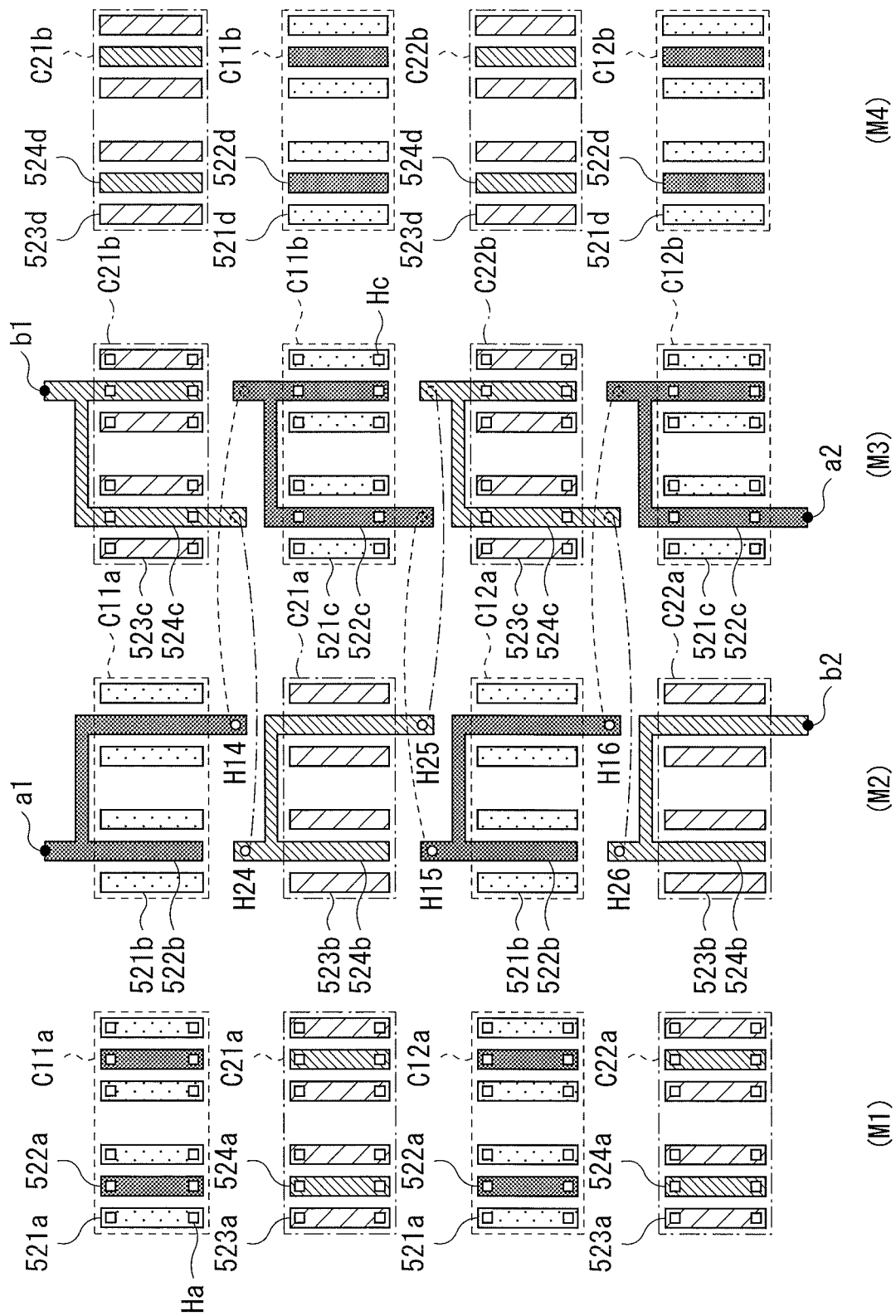
FIG. 24 is a schematic plan view illustrating wiring layout of each of a wiring layer (M1) to a wiring layer (M4) of sampling capacitances according to a third configuration example.
Figure 25A:
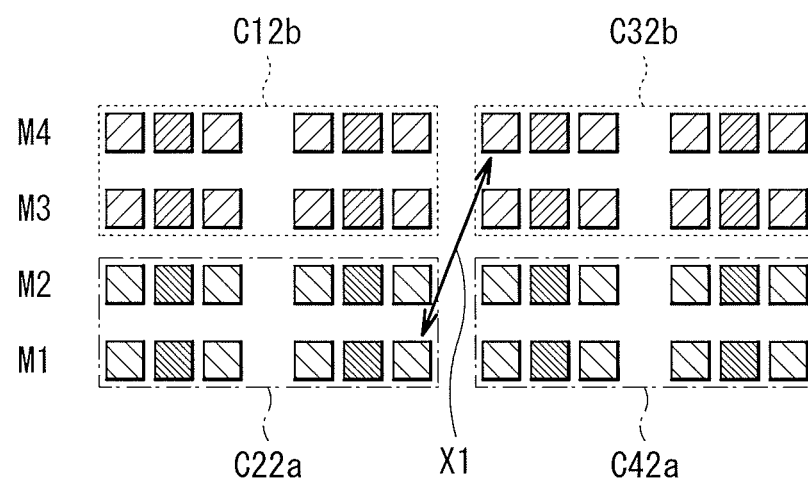
FIG. 25A is a cross-sectional diagram as viewed in an arrow direction corresponding to line IF-IF in FIG. 22.
Figure 25B:
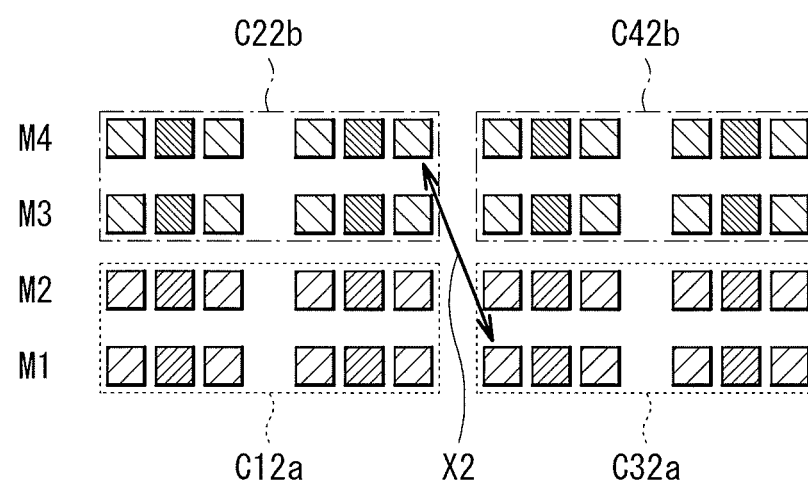
FIG. 25B is a cross-sectional diagram as viewed in an arrow direction corresponding to line IG-IG in FIG. 22.

FIG. 22 is a diagram illustrating an outline of layout of sampling capacitances according to a third embodiment of the disclosure. FIG. 23 is a circuit diagram to explain ends for wiring coupling (extraction electrodes) of the sampling capacitances C1l and C2. FIG. 24 is a schematic plan view illustrating wiring layout of each of the wiring layer (M1) to the wiring layer (M4) of the sampling capacitances C1 and C2 according to a third configuration example. FIG. 25A is a diagram illustrating a cross-sectional configuration as viewed in an arrow direction of line IF-IF in FIG. 22, and FIG. 25B is a diagram illustrating a cross-sectional configuration as viewed in an arrow direction of line IG-IG in FIG. 22.

Note that, FIG. 22 illustrates an outline of layout of sampling capacitances (C1 and C2) that are disposed in an ADC(n) in a certain column of the plurality of ADCs 50A and sampling capacitances (denoted by "C3" and "C4" for convenience) that are disposed in an ADC(n+1) adjacent to the ADC(n). As described in the foregoing first embodiment, the sampling capacitance C1 corresponds to the combined capacitance of the sub-capacitances C11 and C12, and the sampling capacitance C2 corresponds to the combined capacitance of the sub-capacitances C21 and C22. Likewise, the sampling capacitance C3 corresponds to the combined capacitance of the sub-capacitances C31 and C32, and the sampling capacitance C4 corresponds to the combined capacitance of the sub-capacitances C41 and C42.

Also, FIG. 24 illustrates the wiring layout of only the sampling capacitances C1 and C2; however, the sampling capacitances C3 and C4 are also disposed in the layout similar to that of the sampling capacitances C1 and C2.

The sampling capacitances C1 and C2 according to the present embodiment are disposed at respective paired differential input ends of the comparator 51 that is similar to that of the above-described first embodiment, and are suitably used in the ADC 50A or the AD conversion section 50 including the comparator 51. Also in the present embodiment, as illustrated in FIG. 24, FIG. 25A, and FIG. 25B, the sub-capacitances C11, C12, C21, and C22 are provided on an unillustrated semiconductor substrate with use of the four wiring layers M1 to M4, as with the above-described first embodiment. Also, the sub-capacitances C11 and C12 and the sub-capacitances C21 and C22 are arranged in two columns, and the sub-capacitances C11 and C12 and the sub-capacitances C21 and C22 are so arranged as to meander (in a zigzag manner).

In the present embodiment, however, the sub-capacitances C11 and C12 and the sub-capacitances C21 and C22 are so arranged as to meander (in a zigzag manner) not in the plane direction but in the stacked-layer direction (only in the stacked-layer direction). The positions of the sub-capacitances C11 and C12 and the positions of the sub-capacitances C21 and C22 are inverted between adjacent two layers.

More specifically, each of the sub-capacitances C11, C12, C21, and C22 is divided into upper and lower sub-capacitances, and the divided upper and lower sub-capacitances are coupled side by side with each other. In other words, the sub-capacitance C11 includes sub-capacitances C11a and C11b that are coupled side by side with each other. Likewise, the sub-capacitance C12 includes sub-capacitances C12a and C12b that are coupled side by side with each other, the sub-capacitance C21 includes sub-capacitances C21a and C21b that are coupled side by side with each other, and the sub-capacitance C22 includes sub-capacitances C22a and C22b that are coupled side by side with each other.

The sub-capacitances C11a, C12a, C21a, and C22a are each disposed in the wiring layers M1 and M2. The sub-capacitances C11b, C12b, C21b, and C22b are each disposed in the wiring layers M3 and M4. In such a stacked-layer structure, the sub-capacitances C11a and C11b configuring the sub-capacitance C11 are vertically disposed at shifted positions (are disposed at inverted positions in the plane direction). Likewise, the sub-capacitances C12a and C12b, the sub-capacitances C21a and C21b, and the sub-capacitances C22a and C22b respectively configuring the sub-capacitances C12, C21, and C22 are vertically disposed at corresponding shifted positions.

For example, each of the sub-capacitances C11a and C12a may include the electroconductive layers 521a and 522a that are disposed in the wiring layer M1 and the electroconductive layers 521b and 522b that are disposed in the wiring layer M2. The electroconductive layer 521a disposed in the wiring layer M1 and the electroconductive layer 521b disposed in the wiring layer M2 right above the wiring layer M1 face each other, and are coupled with each other through the via Ha through interlayer coupling. Likewise, the electroconductive layer 522a disposed in the wiring layer M1 and the electroconductive layer 522b disposed in the wiring layer M2 right above the wiring layer M1 face each other, and are coupled with each other through the via Ha through interlayer coupling. Note that portions configuring the sub-capacitances C11a and C12a are surrounded by dashed lines in the wiring layers M1 and M2 of FIG. 24.

Each of the sub-capacitances C11b and C12b includes the electroconductive layers 521c and 522c that are disposed in the wiring layer M3 and the electroconductive layers 521d and 522d that are disposed in the wiring layer M4. The electroconductive layer 521c disposed in the wiring layer M3 and the electroconductive layer 521d disposed in the wiring layer M4 right above the wiring layer M3 face each other, and are coupled with each other through the via Hc through interlayer coupling. Likewise, the electroconductive layer 522c disposed in the wiring layer M3 and the electroconductive layer 522d disposed in the wiring layer M4 right above the wiring layer M3 face each other, and are coupled with each other through the via Hc through interlayer coupling. Note that portions configuring the sub-capacitances C11b and C12b are surrounded by dashed lines in the wiring layers M3 and M4 of FIG. 24.

In contrast, each of the sub-capacitances C21a and C22a includes the electroconductive layers 523a and 524a that are disposed in the wiring layer M1 and the electroconductive layers 523b and 524b that are disposed in the wiring layer M2. The electroconductive layer 523a disposed in the wiring layer M1 and the electroconductive layer 523b disposed in the wiring layer M2 right above the wiring layer M1 face each other, and are coupled with each other through the via Ha through interlayer coupling. Likewise, the electroconductive layer 524a disposed in the wiring layer M1 and the electroconductive layer 524b disposed in the wiring layer M2 right above the wiring layer M1 face each other, and are coupled with each other through the via Ha through interlayer coupling. Note that portions configuring the sub-capacitances C21a and C22a are surrounded by alternate long and short dash lines in the wiring layers M1 and M2 of FIG. 24.

Each of the sub-capacitances C21b and C22b includes the electroconductive layers 523c and 524c that are disposed in the wiring layer M3 and the electroconductive layers 523d and 524d that are disposed in the wiring layer M4. The electroconductive layer 523c disposed in the wiring layer M3 and the electroconductive layer 523d disposed in the wiring layer M4 right above the wiring layer M3 face each other, and are coupled with each other through the via Hc through interlayer coupling. The electroconductive layer 524c disposed in the wiring layer M3 and the electroconductive layer 524d disposed in the wiring layer M4 right above the wiring layer M3 face each other, and are coupled with each other through the via Hc through interlayer coupling. Note that portions configuring the sub-capacitances C21b and C22b are surrounded by alternate long and short dash lines in the wiring layers M3 and M4 of FIG. 24.

Such a configuration results in layout in which the positions of the respective sub-capacitances C11a, C12a, C21a, and C22a and the positions of the respective sub-capacitances C11b, C12b, C21b, and C22b are inverted between the wiring layer M2 and the wiring layer M3. Thus, portions of the respective electroconductive layers 521b, 522b, 523b, and 524b and portions of the respective electroconductive layers 521c, 522c, 523c, and 524c are extended for interlayer coupling of the wiring layers M2 and M3.

A portion of the electroconductive layer 522b configuring the sub-capacitance C11a is extended, and a via H14 is provided in the extended portion. The electroconductive layer 522b and the electroconductive layer 522c are electrically coupled with each other through the via H14. Portions of the electroconductive layer 522b configuring the sub-capacitance C12a are extended, and vias H15 and H16 are provided in the extended portions. The electroconductive layer 522b and the electroconductive layer 522c are electrically coupled with each other through the vias H15 and H16.

Portions of the electroconductive layer 524b configuring the sub-capacitance C21a are extended, and vias H24 and H25 are provided in the extended portions. The electroconductive layer 524b and the electroconductive layer 524c are electrically coupled with each other through the vias H24 and H25. A portion of the electroconductive layer 524b configuring the sub-capacitance C22a is extended, and a via H26 is provided in the extended portion. The electroconductive layer 524b and the electroconductive layer 524c are electrically coupled with each other through the via H26.

In the wiring layers M2 and M3, portions of the electroconductive layers 522b, 524b, 522c, and 524c are extended as the ends a1, a2, b1, and b2, respectively, illustrated in FIG. 23. More specifically, a portion of the electroconductive layer 522b configuring the sub-capacitance C11a is extended, and the extended portion serves as the end a1. A portion of the electroconductive layer 522c configuring the sub-capacitance C12b is extended, and the extended portion serves as the end a2. A portion of the electroconductive layer 524c configuring the sub-capacitance C21b is extended, and the extended portion serves as the end b1. A portion of the electroconductive layer 524b configuring the sub-capacitance C22a is extended, and the extended portion serves as the end b2.

As mentioned above, it is possible to arrange the sub-capacitances C11 to C14 and the sub-capacitances C21 to C24 in the layout meandering in a zigzag manner in both the plane direction and the stacked-layer direction while being coupled side by side with one another with use of the four wiring layers M1 to M4. Also, causing the arrangement of the sub-capacitances to meander in the stacked-layer direction makes it possible to reduce the facing area between the sampling capacitances C2 and C3, thereby reducing the crosstalk amount, as illustrated in FIG. 25A and FIG. 25B.

<Fourth Embodiment>

Figure 26:
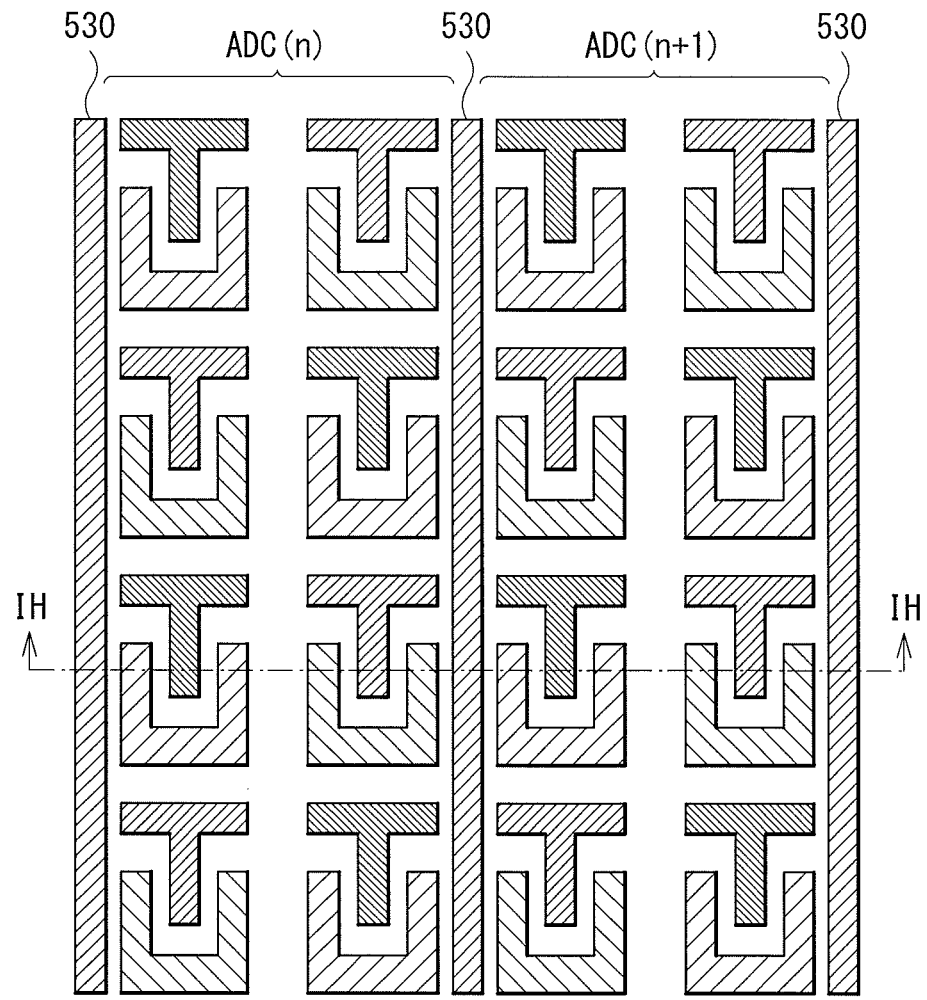
FIG. 26 is a schematic diagram illustrating an outline of a layout of sampling capacitances according to a fourth embodiment of the disclosure.
Figure 27:
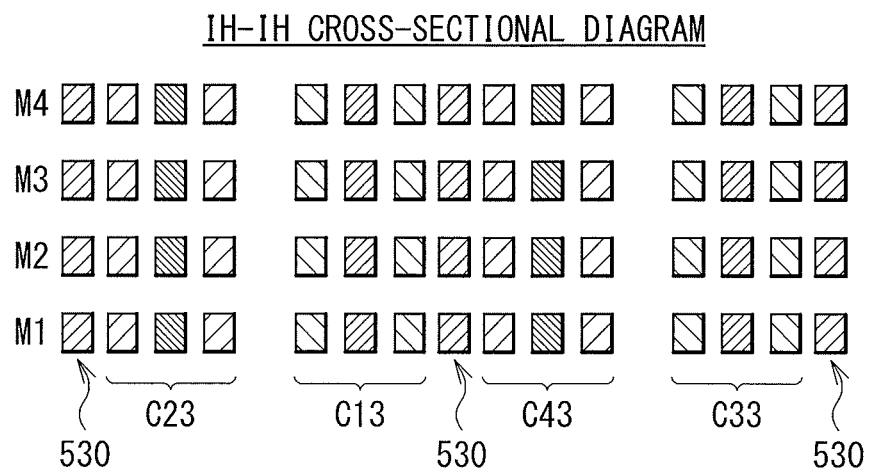
FIG. 27 is a cross-sectional diagram as viewed in an arrow direction corresponding to line IH-IH in FIG. 26.
Figure 28:
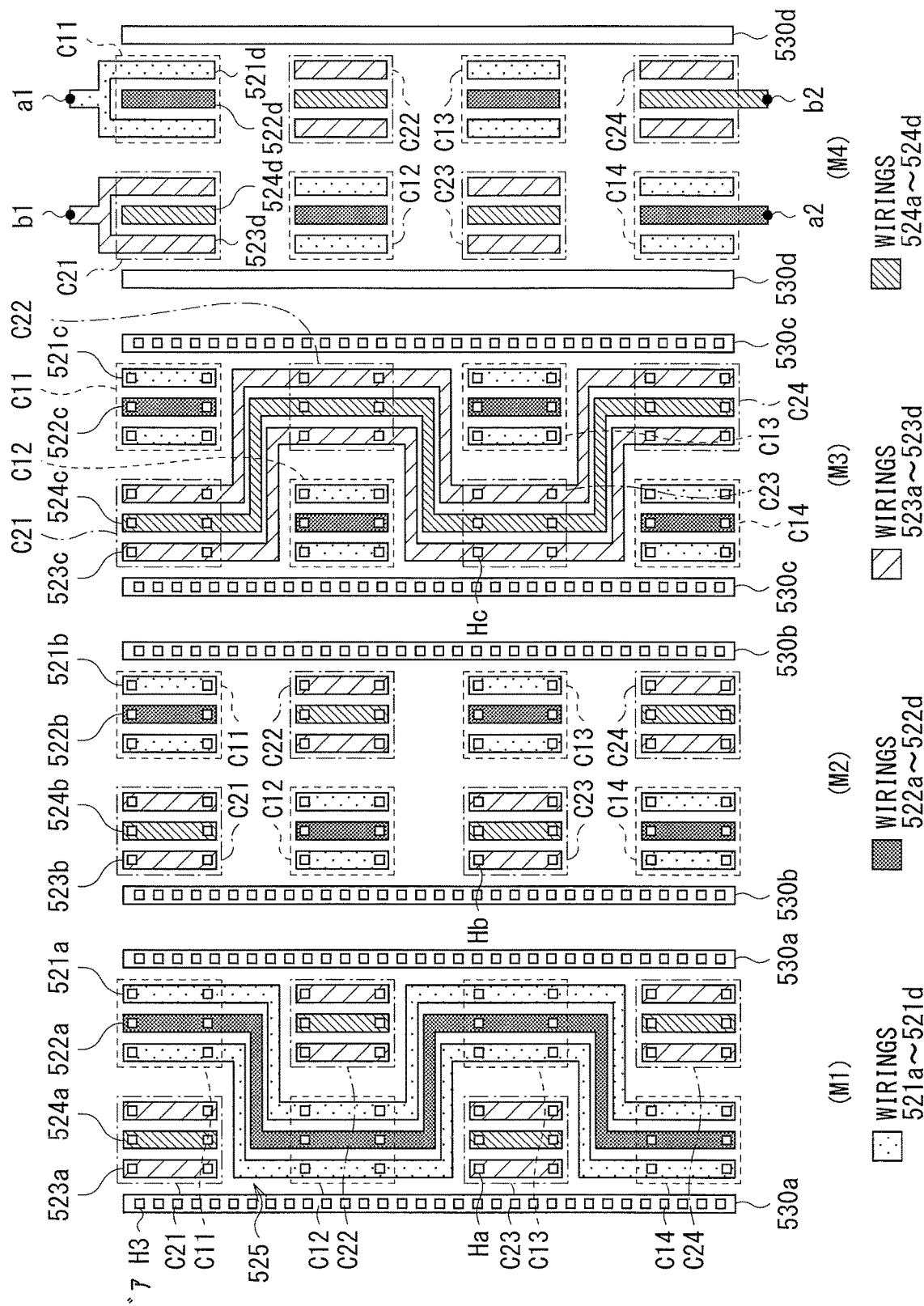
FIG. 28 is a schematic plan view illustrating wiring layer of each of a wiring layer (M1) to a wiring layer (M4) of sampling capacitances according to a fourth configuration example.

FIG. 26 is a diagram illustrating an outline of layout of sampling capacitances according to a fourth embodiment of the disclosure. FIG. 27 is a diagram schematically illustrating a cross-sectional configuration as viewed in an arrow direction of line IH-IH in FIG. 26. FIG. 28 is a schematic plan view illustrating wiring layout of each of the wiring layer (M1) to the wiring layer (M4) of the sampling capacitances C1 and C2 according to a fourth configuration example.

An electrostatic shielding layer (an electrostatic shielding layer 530) may be further disposed between the adjacent ADCs 50A, in addition to the layout of the sampling capacitances C1 and C2 described in the foregoing first to third embodiments. The electrostatic shielding layers 530 are provided to sandwich the sampling capacitances C1 and C2, along the extending direction of the arrangement of the sampling capacitances C1 and C2. Each of the electrostatic shielding layers 530 may be formed with use of the wiring layers M1 to M4, as with the sampling capacitances C1 and C2.

Figure 29:
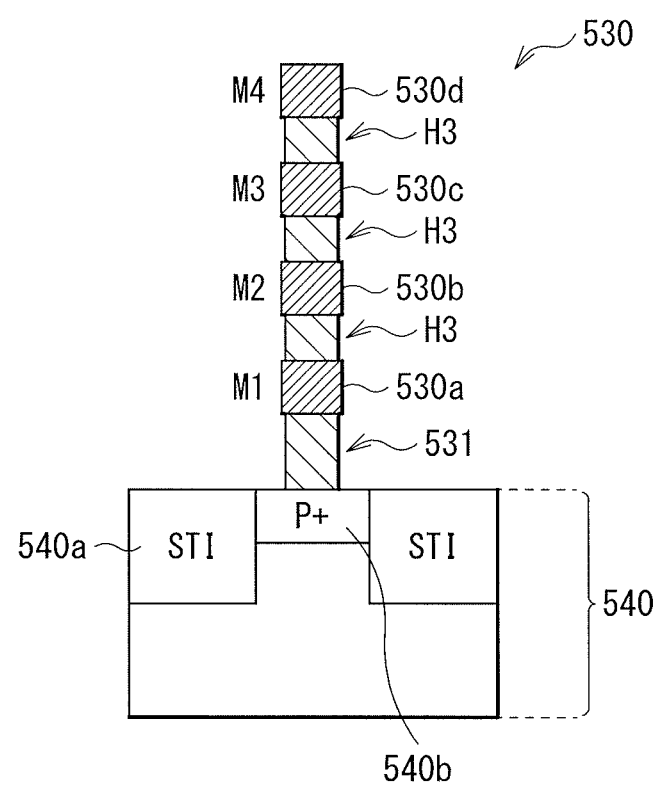
FIG. 29 is a cross-sectional diagram illustrating a detailed configuration of an electrostatic shielding layer illustrated in FIG. 26.

For example, as illustrated in FIG. 27 and FIG. 28, electrostatic shielding layers 530a to 530d are respectively provided in the wiring layers M1 to M4, and the electrostatic shielding layers 530a to 530d are coupled with one another through vias H3 through interlayer coupling. Note that, FIG. 28 illustrates the layout of the sampling capacitances C1 and C2 according to the above-described first configuration example as an example. The electrostatic shielding layer 530 may desirably have a fixed potential. For example, as illustrated in FIG. 29, the electrostatic shielding layers 530a to 530d may be desirably provided on a semiconductor substrate 540 with a contact portion 531 in between. A shallow trench isolation (STI) layer 540a is provided on a surface of the semiconductor substrate 540, and a p-type diffusion layer 540b is provided in an opening of the STI layer 540a. Electrically coupling the p-type diffusion layer 540b with the electrostatic shielding layer 530a through the contact portion 531 makes it possible to fix the potential of the electrostatic shielding layer 530 to the potential same as the substrate potential. The electrostatic shielding layers 530a to 530d are electrically coupled with one another through the vias H3.

Figure 30A:
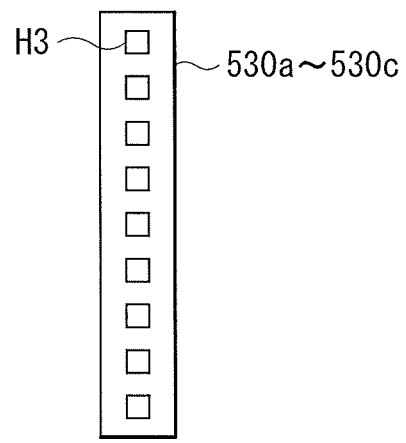
FIG. 30A is a schematic diagram illustrating a layout example of vias for interlayer coupling of the electrostatic shielding layer.
Figure 30B:
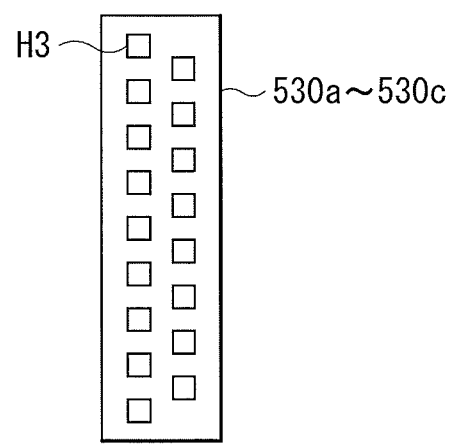
FIG. 30B is a schematic diagram illustrating another layout example of the vias for interlayer coupling of the electrostatic shielding layer.
Figure 30C:
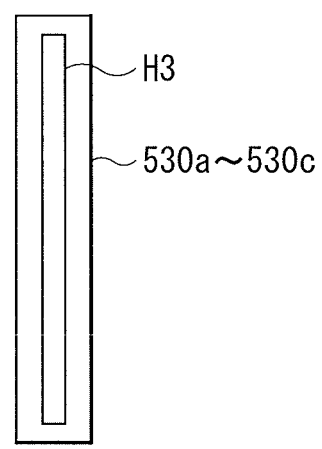
FIG. 30C is a schematic diagram illustrating still another layout example of vias for interlayer coupling of the electrostatic shielding layer.

A plurality of the vias H3 may be arranged, for example, along the extending direction of the electrostatic shielding layers 530a to 530c in each of the wiring layers M1 to M3. The shielding effect is more enhanced as a distance between the vias H3 is smaller. FIG. 30A to FIG. 30C each illustrate an example of the layout of the vias H3. The plurality of vias H3 may be arranged in line along the extending direction of the electrostatic shielding layers 530a to 530c as illustrated in FIG. 30A, or the plurality of the vias H3 may be arranged alternately in a plurality of lines (two lines in this case) (so as to fill the gap between the vias H3) as illustrated in FIG. 30B. Also, as illustrated in FIG. 30C, the via H3 may have a rectangular shape (having a long side along the extending direction) elongated along the extending direction of the electrostatic shielding layers 530a to 530d.

As with the present embodiment, the electrostatic shielding layers 530 may be disposed to sandwich the sampling capacitances C and C2. This makes it possible to suppress occurrence of the parasitic capacitance between the adjacent ADCs 50A. Thus, it is possible to exert effects equivalent to those of the first embodiment.

<Modification Example of Fourth Embodiment>

Figure 31:
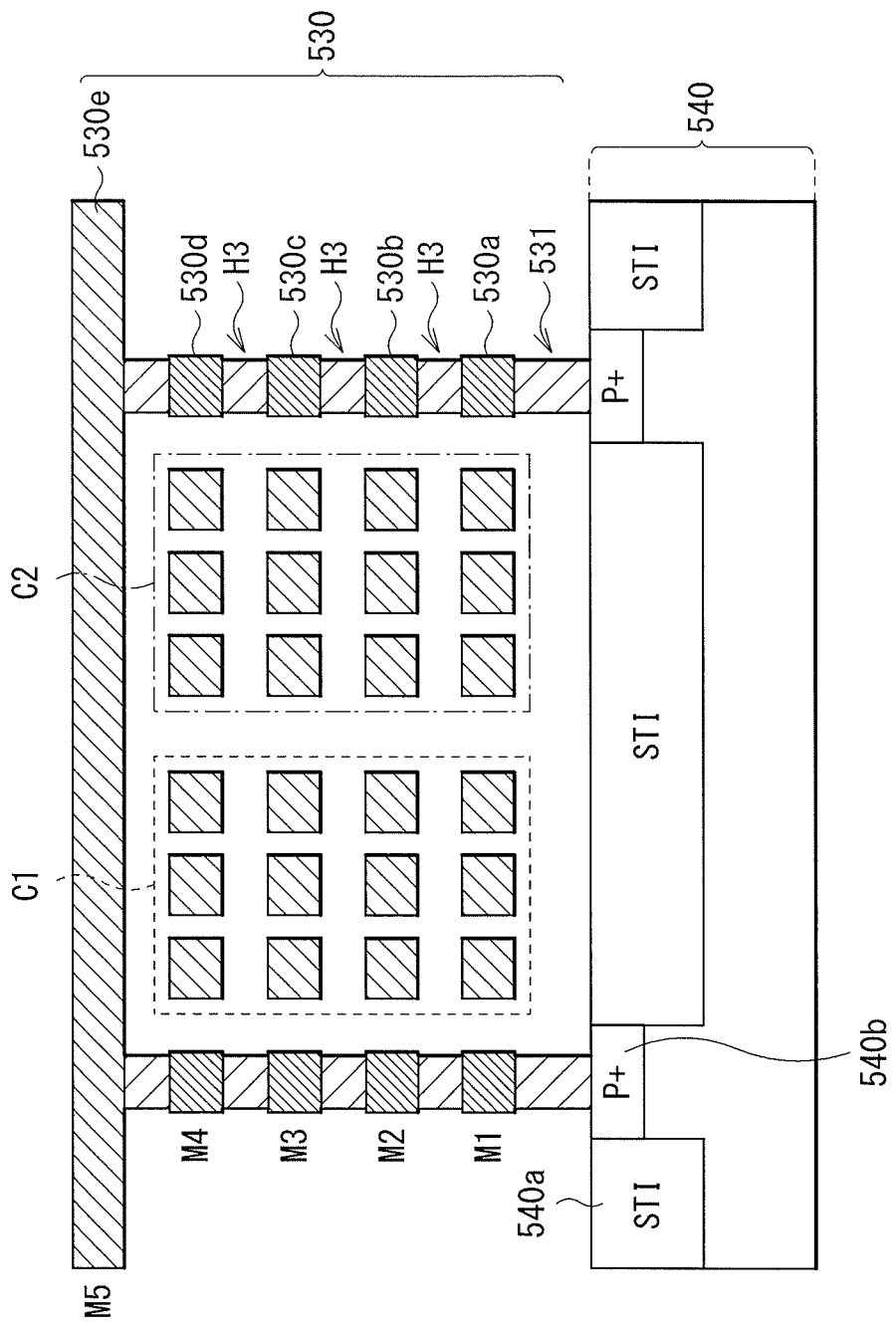
FIG. 31 is a cross-sectional schematic diagram illustrating a configuration of an electrostatic shielding layer according to a modification example of the fourth embodiment.

FIG. 31 is a diagram illustrating a configuration of the electrostatic shielding layer 530 according to a modification example of the above-descried fourth embodiment. Although the configuration is described, in which the electrostatic shielding layers 530 are so disposed between the ADCs 50A as to sandwich the sampling capacitances C1 and C2 in the foregoing fourth embodiment, the electrostatic shielding layer 530 may be so provided as to cover the sampling capacitances C1 and C2.

For example, the electrostatic shielding layers 530a to 530d may be stacked on the semiconductor substrate 540 with use of the wiring layers M1 to M4, and an electrostatic shielding layer 530e may be further formed with use of a wiring layer M5 provided thereon. This shields, in addition to the side walls, upper side of the sampling capacitances C1 and C2, thereby further enhancing the effect of suppressing the parasitic capacitance.

Figure 32:
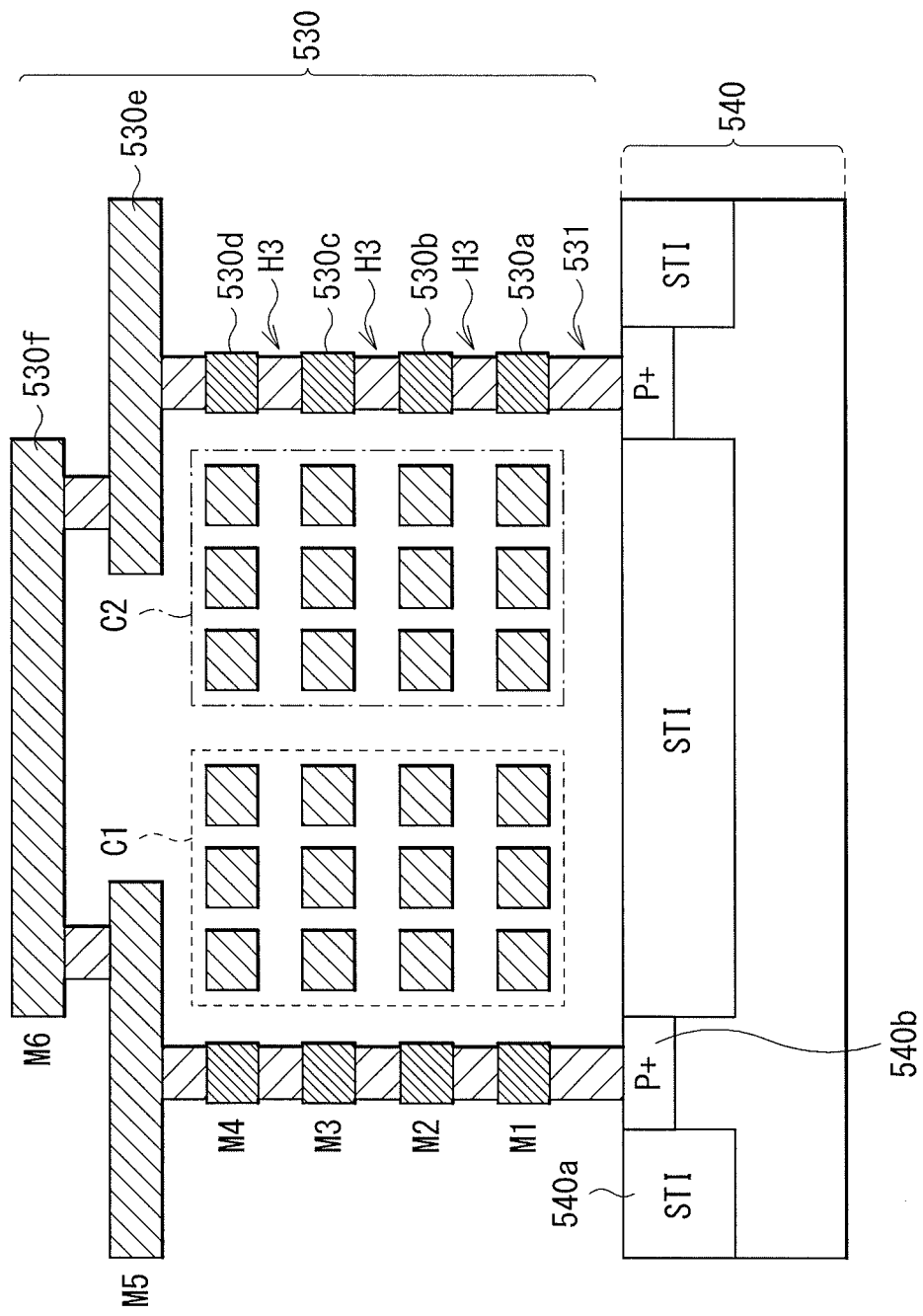
FIG. 32 is a cross-sectional schematic diagram illustrating a configuration of an electrostatic shielding layer according to another modification example of the fourth embodiment.

Further, in a case where the electrostatic shielding layer is disposed also on the sampling capacitances C1 and C2, when wiring density is restricted by the design rule in the wiring layer M5, a wiring layer M6 that is an upper layer of the wiring layer M5 may be used as illustrated in FIG. 32. This allows for a configuration in which the wiring layer M5 is opened and the opening is shielded by an electrostatic shielding layer 530f of the wiring layer M6.

Other modification examples of the sampling capacitances described in the foregoing first to fourth embodiments are described below.

MODIFICATION EXAMPLE 1

Figure 33:
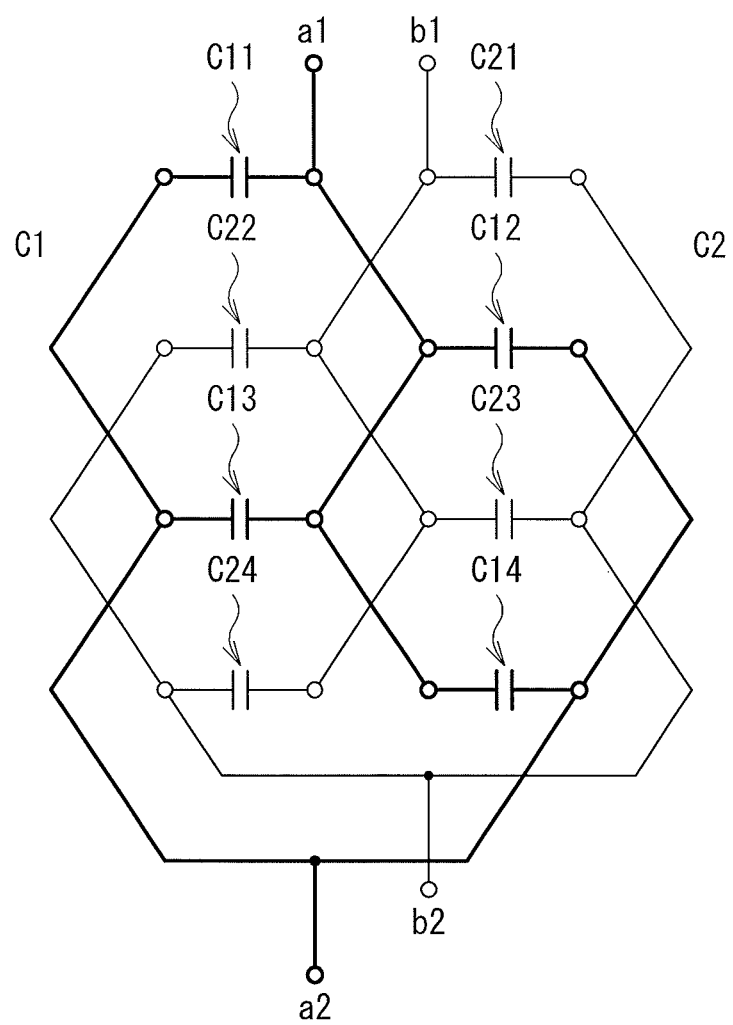
FIG. 33 is a circuit diagram illustrating a circuit configuration of sampling capacitances according to a modification example 1.

FIG. 33 is a diagram illustrating an example of a circuit configuration of the sampling capacitances C1 and C2 according to a modification example 1. As illustrated, the sampling capacitances C1 and C2 respectively include the plurality of sub-capacitances C11 to C14 and the plurality of sub-capacitances C21 to C24. The sub-capacitances C11 to C14 are coupled side by side with one another, and the sub-capacitances C21 to C24 are coupled side by side with one another.

MODIFICATION EXAMPLE 2-1

Figure 34:
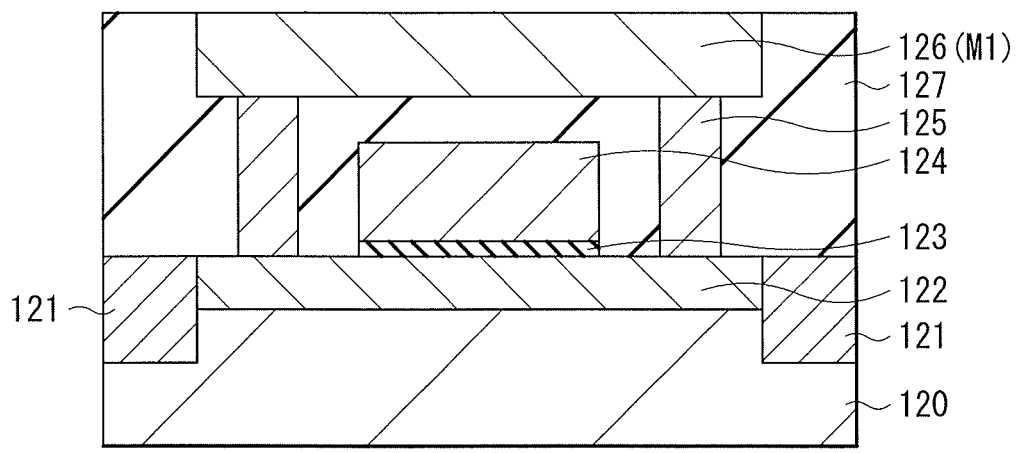
FIG. 34 is a cross-sectional diagram illustrating a configuration of an MOS capacitor according to a modification example 2-1.

The above-described embodiments, for example, describes the case in which the sampling capacitances C1 and C2 are formed with use of two or more wiring layers that are provided on the semiconductor substrate. Alternatively, each of the sampling capacitances C1 and C2 may be, for example, a metal-oxide-semiconductor (MOS) capacitor using each layer of an MOSFET as illustrated in FIG. 34. In the MOSFET, for example, an n-type P-Si gate electrode 124 may be provided on a p-type substrate 120, which includes an STI layer 121 and an n-type diffusion layer 122 provided on the surface thereof with a gate insulation film 123 in between. An interlayer insulation film 127 is provided to cover the n-type P-Si gate electrode 124, and a lower electrode 126 is disposed on the interlayer insulation film 127. A contact layer 125 is provided in the interlayer insulation film 127, and the lower electrode 126 is electrically coupled with the n-type diffusion layer 122 through the contact layer 125. In such a configuration, it is possible to configure a capacitor with use of the electroconductive layers such as the lower electrode 126.

Figure 35:
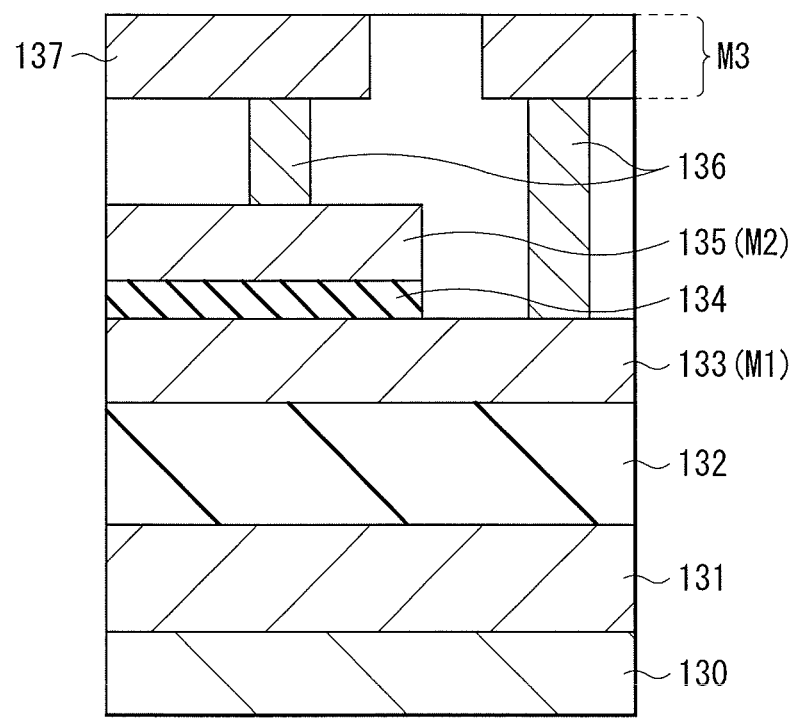
FIG. 35 is a cross-sectional diagram illustrating a configuration of an MIM capacitor according to a modification example 2-2.

Also, each of the sampling capacitances C1 and C2 may be, for example, a metal-insulator-metal (MIM) capacitor as illustrated in FIG. 35. For example, an STI layer 131, an interlayer insulation film 132, a lower electrode 133, a dielectric film 134, and a wiring layer 135 may be provided in this order on a p-type substrate 130. An upper electrode 137 is disposed on the wiring layer 135 with a contact portion 136 in between. In such a configuration, a capacitor may be formed with use of the electroconductive layers such as the lower electrode 133, the wiring layer 135, and the upper electrode 137.

The solid-state imaging apparatus 1 described, for example, in the foregoing embodiments is applicable to various image input apparatuses. Also, the analog-to-digital converter according to the disclosure is applicable to a drive circuit of various electronic apparatuses that do not use the solid-state imaging apparatus. Examples thereof are described below.

APPLICATION EXAMPLE 1

Figure 36:
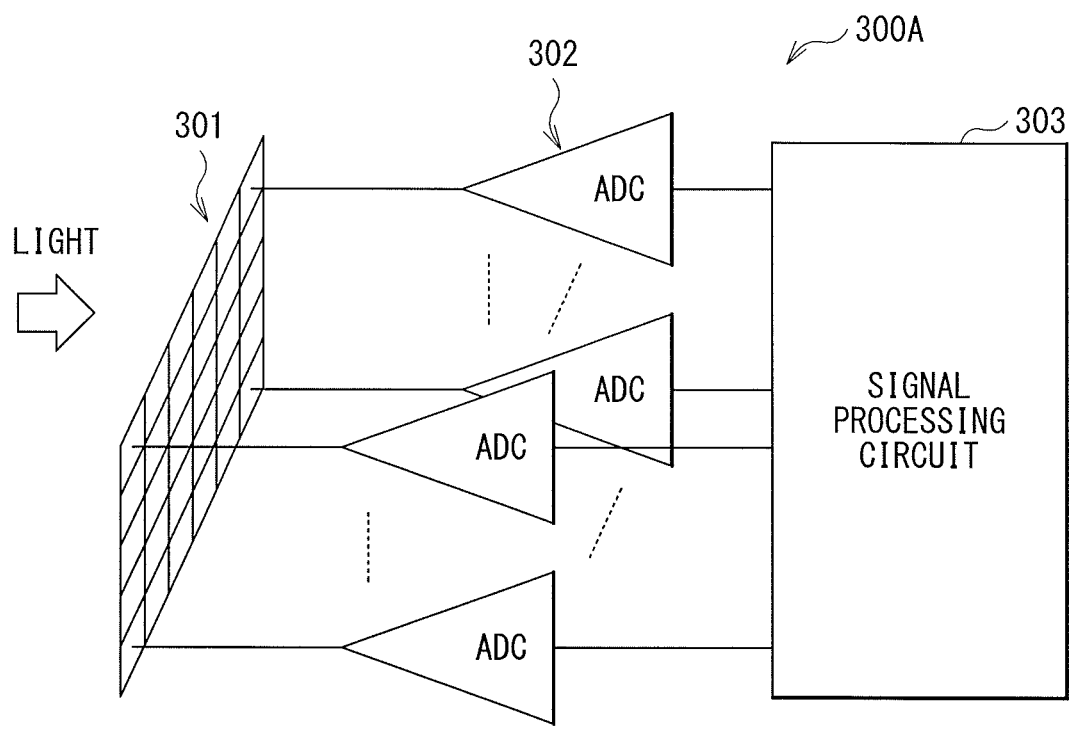
FIG. 36 is a block diagram illustrating a configuration of a camera according to an application example 1.

FIG. 36 is a block diagram illustrating a configuration of a digital camera (a digital still camera, or a digital video camera) 300A. The digital camera 300A includes a pixel sensor section 301 in which pixels are two-dimensionally arranged, an ADC group 302, and a signal processing circuit 303. The ADC 50A including the sampling capacitances C1 and C2 according to any of the above-described embodiments is disposed in the ADC group 302. Also, when the pixels are arranged two-dimensionally, the ADC 50A is applicable to an XY scanner, in addition to the digital camera.

APPLICATION EXAMPLE 2

Figure 37:
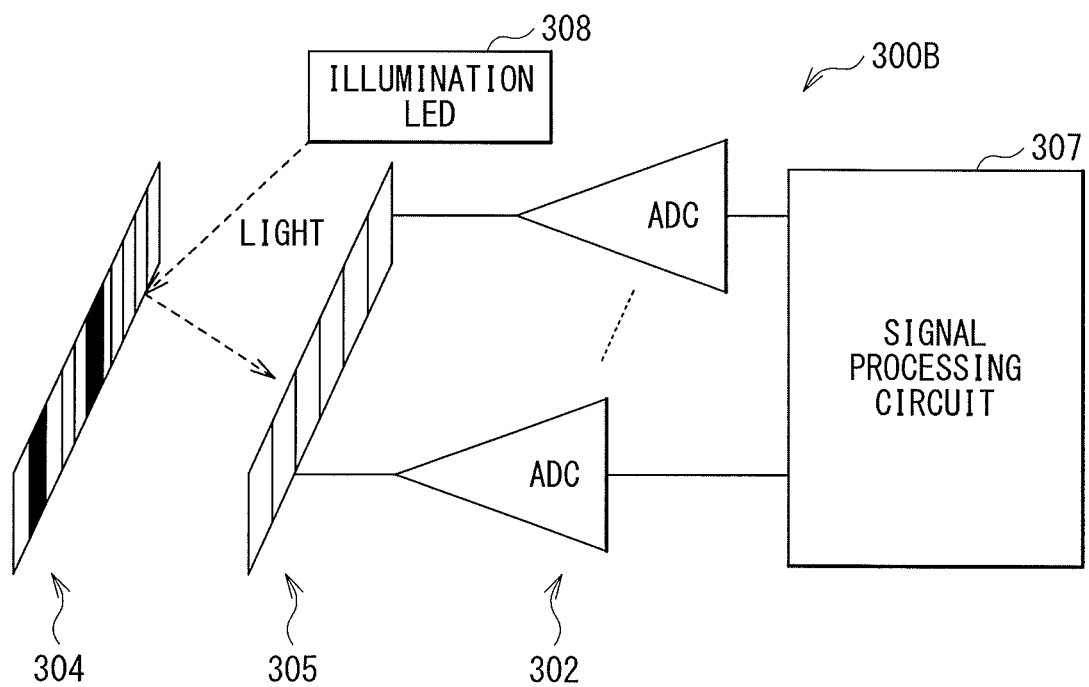
FIG. 37 is a block diagram illustrating a configuration of a barcode reader according to an application example 2.

FIG. 37 is a block diagram illustrating a configuration of a barcode reader 300B. The barcode reader 300B includes a pixel sensor section 305 in which pixels are one-dimensionally arranged, an ADC group 306, a signal processing circuit 307, and an illumination LED 308 that applies light to a barcode 304. The ADC 50A including the sampling capacitances C and C2 according to any of the above-described embodiments is disposed in the ADC group 306.

APPLICATION EXAMPLE 3

Figure 38:
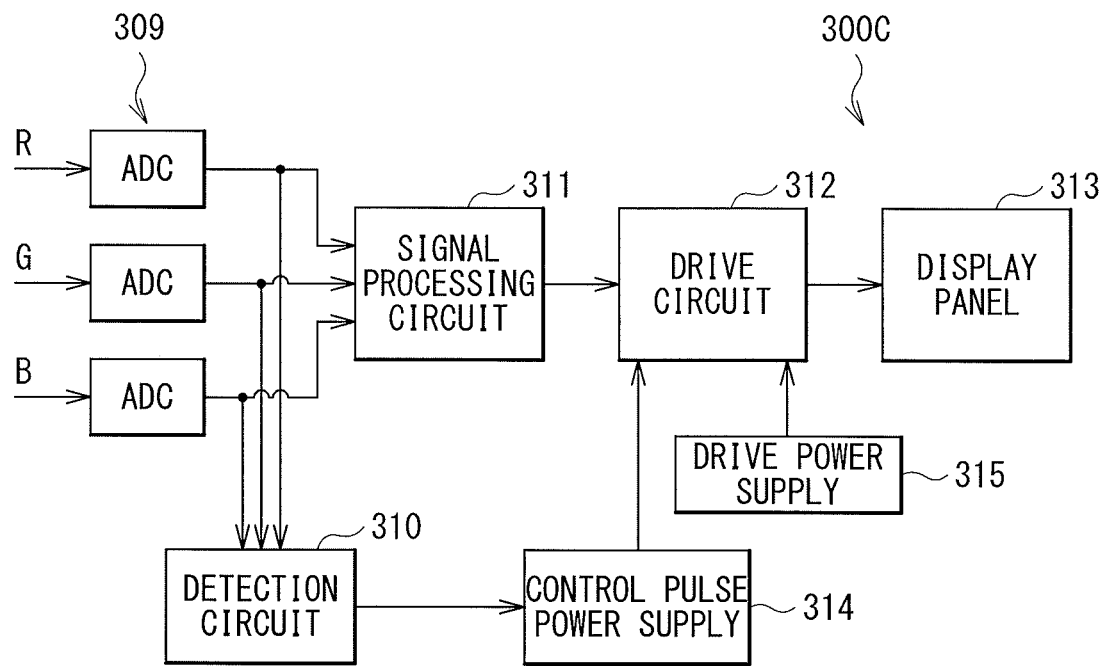
FIG. 38 is a block diagram illustrating a configuration of a display unit according to an application example 3.

FIG. 38 is a block diagram illustrating a configuration of a display apparatus 300C. The display apparatus 300C may be, for example, a plasma display, and includes ADC groups 309 provided for each image signal of R, G, and B, a detection circuit 310, a signal processing circuit 311, a drive circuit 312, a display panel 313, a control pulse power supply 314, and a drive power supply 315. The ADC 50A including the sampling capacitances C and C2 according to any of the above-described embodiments is disposed in the ADC group 309. Note that the ADC 50A is applicable to other displays such as an CRT display, a liquid crystal display, and an organic EL display, without limitation to the plasma display.

APPLICATION EXAMPLE 4

Figure 39:
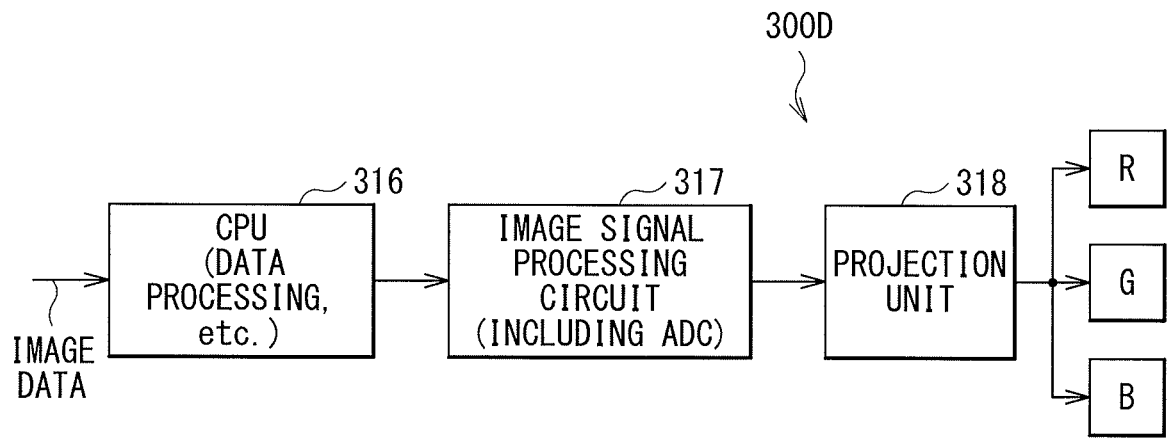
FIG. 39 is a block diagram illustrating a configuration of a projector according to an application example 4.

FIG. 39 is a block diagram illustrating a configuration of a projector 300D. The projector 300D includes a CPU 316 performing processing of image data, an image signal processing circuit 317 including an ADC, and a projection unit 318. The ADC 50A including the sampling capacitances C1 and C2 according to any of the above-described embodiments is disposed in the image signal processing circuit 317.

APPLICATION EXAMPLE 5

Figure 40:
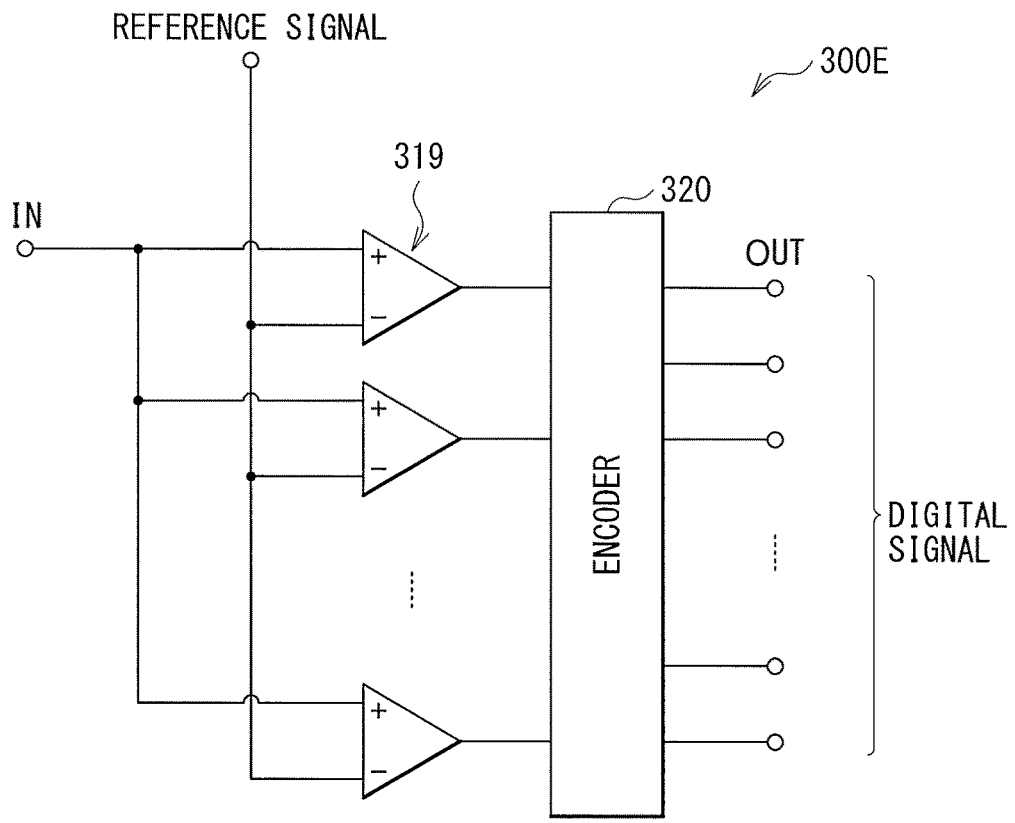
FIG. 40 is a block diagram illustrating a configuration of a measurement instrument according to an application example 5.

FIG. 40 is a block diagram illustrating a configuration of a measurement instrument 300E. The measurement instrument 300E includes a comparator group 319 that receives an analog signal and a reference signal, and an encoder 320. The sampling capacitances C1 and C2 according to any of the above-described embodiments are disposed at respective differential input ends of the comparator group 319. In this way, the disclosure is applicable also to a typical comparator of a parallel ADC. Examples of the electronic apparatus having such a configuration may include an audio apparatus, in addition to the measurement instrument.

APPLICATION EXAMPLE 6

Figure 41:
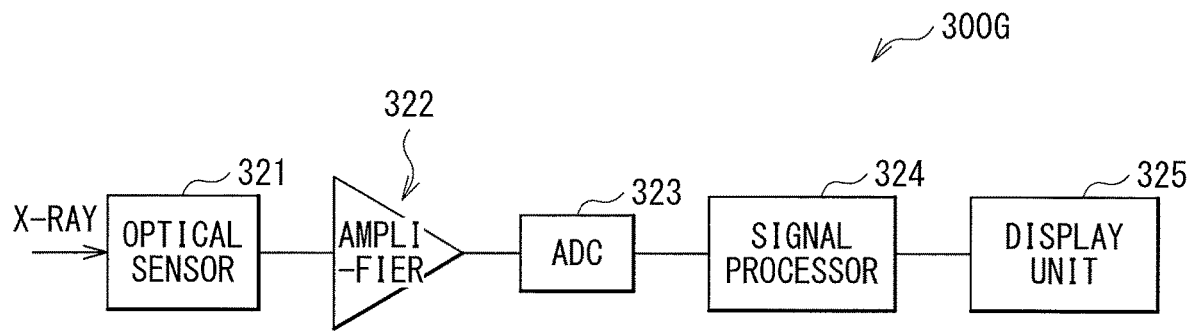
FIG. 41 is a block diagram illustrating a configuration of an X-ray detector according to an application example 6.

FIG. 41 is a block diagram illustrating a configuration of an X-ray detector 300G. The X-ray detector 300G includes an optical sensor 321, an amplifier 322, an ADC 323, a signal processor 324, and a display unit 325. The ADC 50A including the sampling capacitances C1 and C2 according to any of the above-described embodiments is disposed in the ADC 323.

Although some embodiments, modification examples, and application examples have been described above, the contents of the disclosure are not limited thereto, and various modification may be made. For example, although the configuration in which the sampling capacitances C1 and C2 are each divided into four sub-capacitances and the four sub-capacitances are coupled side by side with one another has been exemplified, for example, in the above-described embodiments, the number of sub-capacitances (a division number) is not limited to four, and may be two, three, or five or more.

Figure 42:
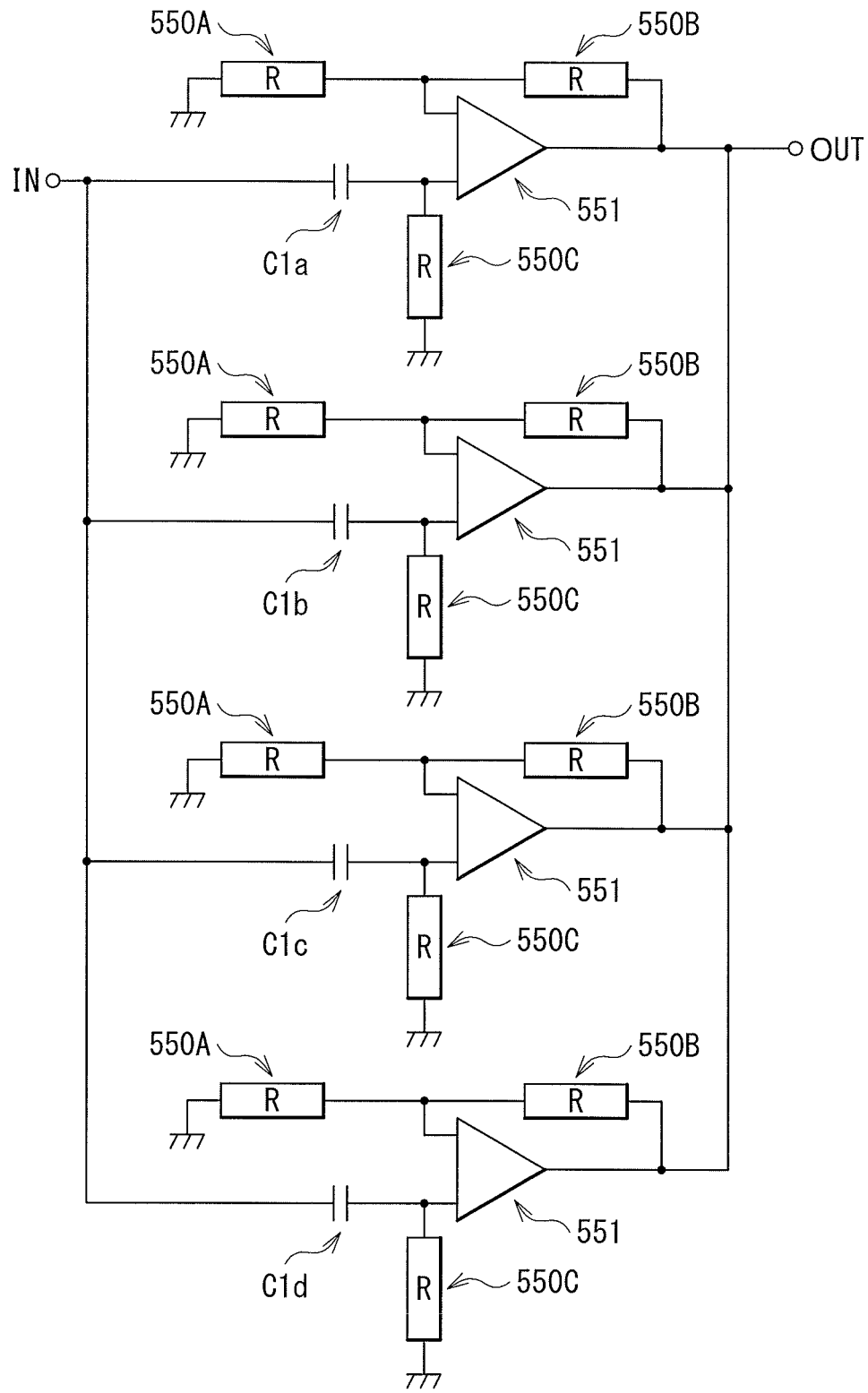
FIG. 42 is a circuit diagram illustrating an example of a differential circuit according to another modification example (an example of a differential circuit other than an analog-to-digital converter).
Figure 43:
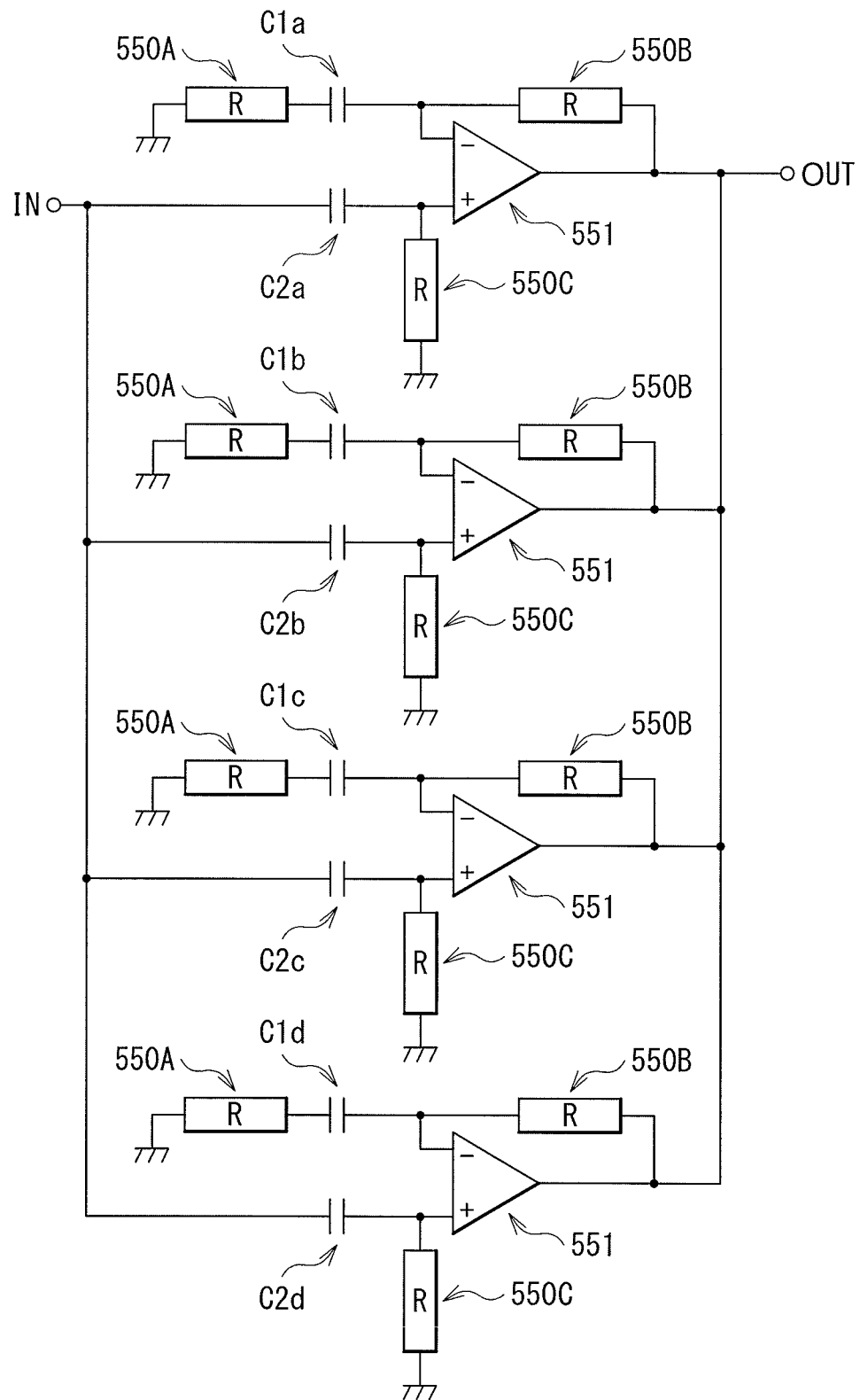
FIG. 43 is a circuit diagram illustrating an example of a differential circuit according to still another modification example (an example of a differential circuit other than an analog-to-digital converter).

Also, the case in which the sampling capacitances C1 and C2 are coupled with the comparator of the analog-to-digital converter has been described as an example in the above-described embodiments, for example. The above-described sampling capacitances C1 and C2, however, are applicable to a differential circuit other than the analog-to-digital converter. FIG. 42 and FIG. 43 each illustrate an example of a differential circuit. The examples relate to an amplification circuit using a differential amplifier (an operational amplifier), and one differential amplifier is configured of a plurality of differential amplifiers that are coupled side by side with one another. Such a configuration makes it possible to increase a maximum output current value of the differential amplifier and to reduce noise of the differential amplifier.

In the example of FIG. 42, four AC amplifiers are coupled side by side with one another. The AC amplifiers each include resistors 550A to 550C, capacitors C1$a$ to C1$d$ (the sampling capacitance C1), an unillustrated MOSFET (a field effect transistor), and a differential amplifiers (operational amplifiers 551). In this configuration, a parasitic capacitance caused by coupling between the capacitors C1$b$ and C1$c$ becomes large in the capacitors C1$a$ to C1$d$ that are each coupled with an input terminal of corresponding operational amplifier 551, which deteriorates frequency characteristics of a gain of the AC amplifiers.

In the example of FIG. 43, four AC amplifiers are coupled side by side with one another. The AC amplifiers each include the resistors 550A to 550C, the capacitors C1$a$ to C1$d$ (the sampling capacitance C1), capacitors C2$a$ to C2$d$ (the sampling capacitance C2), an unillustrated MOSFET (a field effect transistor), and the operational amplifiers 551. In this configuration, the parasitic capacitances caused by coupling between the capacitors C2$a$ and C1$b$ and coupling between the capacitors C2$c$ and C1$d$ become large, which deteriorates frequency characteristics of a gain of the AC amplifiers.

Even in the above-described examples, however, the capacitors C1$a$ to C1$d$ and C2$a$ to C2$d$ are designed with layout similar to that of the above-described sampling capacitances C1 and C2, which makes it possible to suppress deterioration of the frequency characteristics of the gain and to achieve both increase in the output current value and noise reduction.

Note that the effects described, for example, in the foregoing embodiments are illustrative and non-limiting. Effects achieved by the technology may be effects other than those described above or may further include other effects.

It is to be noted that the disclosure may have the following configurations.

(1)

An analog-to-digital converter, including:

a comparator having paired differential input ends; and a first capacitor and a second capacitor each provided at respective differential input ends, wherein the first capacitor includes a plurality of first sub-capacitors that are coupled side by side with one another, the second capacitor includes a plurality of second sub-capacitors that are coupled side by side with one another, and the plurality of first sub-capacitors and the plurality of second sub-capacitors are mixedly arranged in each column of a plurality of columns.

(2)

The analog-to-digital converter according to (1), wherein the plurality of first sub-capacitors and the plurality of second sub-capacitors are alternately arranged in two columns.

(3)

The analog-to-digital converter according to (1) or (2), wherein the plurality of first sub-capacitors have layout that is mirror-inverted to layout of the plurality of second sub-capacitors (4)

The analog-to-digital converter according to any one of (1) to (3), wherein each of the first sub-capacitors and the second sub-capacitors includes first and second electroconductive layers that are each provided in two or more layers and are coupled with each other through interlayer coupling, and are disposed to face each other.

(5)

The analog-to-digital converter according to (4), wherein a first wiring layer that couples the first sub-capacitors with one another and a second wiring layer that couples the second sub-capacitors with one another are disposed in selective layers that are different from each other.

(6)

The analog-to-digital converter according to (5), wherein the first and second electroconductive layers that configure each of the first sub-capacitors and the first wiring layer are integrally formed and have a shape meandering in a rectangular wave shape in a planar view, in a layer including the first wiring layer, and the first and second electroconductive layers that configure each of the second sub-capacitors and the second wiring layer are integrally formed and have a shape meandering in a rectangular wave shape in a planar view, in a layer including the second wiring layer.

(7)

The analog-to-digital converter according to any one of (2) to (6), wherein the plurality of first sub-capacitors and the plurality of second sub-capacitors are each arranged in a zigzag manner in a planar view.

(8)

The analog-to-digital converter according to any one of (2) to (6), wherein the plurality of first sub-capacitors and the plurality of second sub-capacitors are each arranged in a zigzag manner in a stacked-layer direction.

(9)

The analog-to-digital converter according to (8), wherein each of the first sub-capacitors and the second sub-capacitors includes first and second electroconductive layers that are each provided in two or more layers and are coupled with each other through interlayer coupling, and are disposed to face each other, positions of the first sub-capacitors and positions of the second sub-capacitors are inverted between adjacent two layers, and one of the first and second electroconductive layers is extended, and a through hole for the interlayer coupling is provided in the extended portion.

(10)

The analog-to-digital converter according to (9), wherein the plurality of first sub-capacitors are integrally formed and have a shape meandering in a rectangular wave shape in a planar view, and a portion of the meandering shape is extended to have the through hole, in a first layer of the adjacent two layers, and the plurality of second sub-capacitors are integrally formed and have a shape meandering in a rectangular wave shape in a planar view, and a portion of the meandering shape is extended to have the through hole, in a second layer of the adjacent two layers.

(11)

The analog-to-digital converter according to (9), wherein, in the adjacent two layers, a portion of one of the first and second electroconductive layers of each of the first sub-capacitors is extended, and the extended portion has the through hole, and a portion of one of the first and second electroconductive layers of each of the second sub-capacitors is extended, and the extended portion has the through hole.

(12)

The analog-to-digital converter according to any one of (1) to (11), further including electrostatic shielding layers that are provided to sandwich the first sub-capacitors and the second sub-capacitors.

(13)

The analog-to-digital converter according to (12), wherein each of the electrostatic shielding layers extends along arrangement of the plurality of first sub-capacitors and the plurality of second sub-capacitors, and is provided in two or more layers through interlayer coupling via a through hole.

(14)

The analog-to-digital converter according to (13), wherein the through hole includes a plurality of through holes arranged along an extending direction of the electrostatic shielding layers.

(15)

The analog-to-digital converter according to (14), wherein the through holes are arranged alternately in two lines along the extending direction.

(16)

The analog-to-digital converter according to (13), wherein the through hole is provided in a rectangular region that has a long side along the extending direction.

(17)

The analog-to-digital converter according to any one of (12) to (16), wherein one of the electrostatic shielding layer is provided to further cover the plurality of first sub-capacitors and the plurality of second sub-capacitors.

(18)

The analog-to-digital converter according to any one of (1) to (17), wherein each of the first capacitor and the second capacitor is a metal-oxide-semiconductor capacitor or a metal-insulator-metal capacitor.

(19)

A solid-state imaging apparatus provided with an analog-to-digital converter, the analog-to-digital converter including:

a comparator having paired differential input ends; and a first capacitor and a second capacitor each provided at respective differential input ends, wherein the first capacitor includes a plurality of first sub-capacitors that are coupled side by side with one another, the second capacitor includes a plurality of second sub-capacitors that are coupled side by side with one another, and the plurality of first sub-capacitors and the plurality of second sub-capacitors are mixedly arranged in each column of a plurality of columns.

(20)

An electronic apparatus provided with an analog-to-digital converter, the analog-to-digital converter including:

a comparator having paired differential input ends; and a first capacitor and a second capacitor each provided at respective differential input ends, wherein the first capacitor includes a plurality of first sub-capacitors that are coupled side by side with one another, the second capacitor includes a plurality of second sub-capacitors that are coupled side by side with one another, and the plurality of first sub-capacitors and the plurality of second sub-capacitors are mixedly arranged in each column of a plurality of columns.

This application is based upon and claims the benefit of priority of the Japanese Patent Application No. 2015-042633 filed in the Japan Patent Office on Mar. 4, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An analog-to-digital converter, comprising:
a comparator having paired differential input ends, and
a first capacitor and a second capacitor each provided at respective differential input ends,
wherein the first capacitor includes a plurality of first sub-capacitors that are coupled side by side with one another,
wherein at least a first one of the first sub-capacitors includes paired comb-shaped electroconductive layers,
wherein the second capacitor includes a plurality of second sub-capcitors that are coupled side by side with one another,
wherein at least a first one of the second sub-capacitors includes paired comb-shaped electroconductive layers, and
wherein the plurality of first sub-capacitors and the plurality of second sub-capacitors are mixedly arranged in each column of a plurality of columns, wherein each of the first sub-capacitors and the second sub-capacitors includes first and second electroconductive layers that are each provided in two or more layers and are coupled with each other through interlayer coupling and are disposed to face each other, and wherein a first wiring layer that couples the first sub-capacitors with one another and a second wiring layer that couples the second sub-capacitors with one another are disposed in selective layers that are different from each other.

2. The analog-to-digital converter according to claim 1, wherein the plurality of first sub-capacitors and the plurality of second sub-capacitors are alternately arranged in two columns.

3. The analog-to-digital converter according to claim 2, wherein the plurality of first sub-capacitors and the plurality of second sub-capacitors are each arranged in a zigzag manner in a planar view.

4. The analog-to-digital converter according to claim 1, wherein the plurality of first sub-capacitors have layout that is mirror-inverted to layout of the plurality of second sub-capacitors.

5. The analog-to-digital converter according to claim 1, wherein
the first and second electroconductive layers that configure each of the first sub-capacitors and the first wiring layer are integrally formed and have a shape meandering in a rectangular wave shape in a planar view, in a layer including the first wiring layer, and
the first and second electroconductive layers that configure each of the second sub-capacitors and the second wiring layer are integrally formed and have a shape meandering in a rectangular wave shape in a planar view, in a layer including the second wiring layer.

6. The analog-to-digital converter according to claim 1, further comprising electrostatic shielding layers that are provided to sandwich the first sub-capacitors and the second sub-capacitors.

7. The analog-to-digital converter according to claim 6, wherein each of the electrostatic shielding layers extends along arrangement of the plurality of first sub-capacitors and the plurality of second sub-capacitors, and is provided in two or more layers through interlayer coupling via a through hole.

8. The analog-to-digital converter according to claim 7, wherein the through hole comprises a plurality of through holes arranged along an extending direction of the electrostatic shielding layers.

9. The analog-to-digital converter according to claim 8, wherein the through holes are arranged alternately in two lines along the extending direction.

10. The analog-to-digital converter according to claim 7, wherein the through hole is provided in a rectangular region that has a long side along the extending direction.

11. The analog-to-digital converter according to claim 6, wherein one of the electrostatic shielding layers is provided to further cover the plurality of first sub-capacitors and the plurality of second sub-capacitors.

12. The analog-to-digital converter according to claim 1, wherein each of the first capacitor and the second capacitor is a metal-oxide-semiconductor capacitor or a metal-insulator-metal capacitor.

13. An analog-to digital converter, comprising:
a comparator having paired differential input ends, and
a first capacitor and a second capacitor each provided at respective differential input ends,
wherein the first capacitor includes a plurality of first sub-capacitors that are coupled side by side with one another,
wherein at least a first one of the first sub-capacitors includes paired comb-shaped electroconductive layers, wherein the second capacitor includes a plurality of second sub-capacitors that are coupled side by side with one another, wherein at least a first one of the second sub-capacitors includes paired comb-shaped electroconductive layers, and wherein the plurality of first sub-capacitors and the plurality of second sub-capacitors are mixedly arranged in each column of a plurality of columns wherein the plurality of first sub-capacitors and the plurality of second sub-capacitors are alternately arranged in two columns, and wherein the plurality of first sub-capacitors and the plurality of second sub-capacitors are each arranged in a zigzag manner in a stacked-layer direction.

14. The analog-to-digital converter according to claim 13, wherein each of the first sub-capacitors and the second sub-capacitors includes first and second electroconductive layers that are each provided in two or more layers and are coupled with each other through interlayer coupling, and are disposed to face each other, positions of the first sub-capacitors and positions of the second sub-capacitors are inverted between adjacent two layers, and one of the first and second electroconductive layers is extended, and a through hole for the interlayer coupling is provided in the extended portion.

15. The analog-to-digital converter according to claim 14, wherein the plurality of first sub-capacitors are integrally formed and have a shape meandering in a rectangular wave shape in a planar view, and a portion of the meandering shape is extended to have the through hole, in a first layer of the adjacent two layers, and the plurality of second sub-capacitors are integrally formed and have a shape meandering in a rectangular wave shape in a planar view, and a portion of the meandering shape is extended to have the through hole, in a second layer of the adjacent two layers.

16. The analog-to-digital converter according to claim 14, wherein, in the adjacent two layers, a portion of one of the first and second electroconductive layers of each of the first sub-capacitors is extended, and the extended portion has the through hole, and a portion of one of the first and second electroconductive layers of each of the second sub-capacitors is extended, and the extended portion has the through hole.

17. The analog-to-digital converter according to claim 13, further comprising electrostatic shielding layers that are provided to sandwich the first sub-capacitors and the second sub-capacitors.

18. The analog-to-digital converter according to claim 17, wherein each of the electrostatic shielding layers extends along arrangement of the plurality of first sub-capacitors and the plurality of second sub-capacitors, and is provided in two or more layers through interlayer coupling via a through hole.

19. The analog-to-digital converter according to claim 18, wherein the through hole comprises a plurality of through holes arranged along an extending direction of the electrostatic shielding layers.

20. A solid-state imaging apparatus provided with an analog-to-digital converter, the analog-to-digital converter comprising:

a comparator having paired differential input ends; and a first capacitor and a second capacitor each provided at respective differential input ends, wherein the first capacitor includes a plurality of first sub-capacitors that are coupled side by side with one another, wherein at least a first one of the first sub-capacitors includes paired comb-shaped electroconductive layers, wherein the second capacitor includes a plurality of second sub-capacitors that are coupled side by side with one another, wherein at least a first one of the second sub-capacitors includes paired comb-shaped electroconductive layers, wherein the plurality of first sub-capacitors and the plurality of second sub-capacitors are mixedly arranged in each column of a plurality of columns, wherein the plurality of first sub-capacitors and the plurality of second sub-capacitors are alternately arranged in two columns, and wherein the plurality of first sub-capacitors and the plurality of second sub-capacitors are each arranged in a zigzag manner in a stacked-layer direction.

* * * * *